(12) United States Patent
Yamada et al.

(10) Patent No.: US 7,075,820 B2
(45) Date of Patent: Jul. 11, 2006

(54) SEMICONDUCTOR MEMORY DEVICE FOR DYNAMICALLY STORING DATA WITH CHANNEL BODY OF TRANSISTOR USED AS STORAGE NODE

(75) Inventors: Takashi Yamada, Ebina (JP); Fumio Horiguchi, Tokyo (JP); Takashi Ohsawa, Yokohama (JP); Yoshihisa Iwata, Yokohama (JP); Yoshiaki Asao, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 235 days.

(21) Appl. No.: 10/845,403

(22) Filed: May 14, 2004

(65) Prior Publication Data

US 2005/0141262 A1 Jun. 30, 2005

(30) Foreign Application Priority Data

Dec. 26, 2003 (JP) ............................. 2003-433930

(51) Int. Cl.
*G11C 11/34* (2006.01)
*G11C 7/00* (2006.01)

(52) U.S. Cl. ................... 365/174; 365/164; 257/314

(58) Field of Classification Search ................ 365/174, 365/164; 257/314, 315
See application file for complete search history.

(56) References Cited

U.S. PATENT DOCUMENTS

| 6,538,916 | B1 | 3/2003 | Ohsawa |
| 6,548,848 | B1 * | 4/2003 | Horiguchi et al. .......... 257/296 |
| 6,567,330 | B1 | 5/2003 | Fujita et al. |
| 6,617,651 | B1 | 9/2003 | Ohsawa |
| 6,621,725 | B1 | 9/2003 | Ohsawa |
| 6,632,723 | B1 | 10/2003 | Watanabe et al. |
| 6,650,565 | B1 | 11/2003 | Ohsawa |
| 6,778,424 | B1 * | 8/2004 | Iwata et al. ................. 365/149 |

FOREIGN PATENT DOCUMENTS

| JP | 8-64778 | 3/1996 |
| JP | 2002-83945 | 3/2002 |
| JP | 2002-246571 | 8/2002 |
| JP | 2002-329795 | 11/2002 |
| JP | 2002-343886 | 11/2002 |
| JP | 2003-31693 | 1/2003 |
| JP | 2003-86712 | 3/2003 |

OTHER PUBLICATIONS

Takashi Ohsawa, et al., "Memory Design Using a One-Transistor Gain Cell on SOI", IEEE Journal of Solid-State Circuits, vol. 37, No. 11, Nov. 2002, pp. 1510-1522.
Kazumi Inoh, et al., "FBC (Floating Body Cell) for Embedded Dram on SOI", 2003 Symposium on VLSI Technology Digest of Technical Papers, 2003, pp. 63-64.

* cited by examiner

*Primary Examiner*—Son T. Dinh
(74) *Attorney, Agent, or Firm*—Oblon, Spivak, McClelland, Maier & Neustadt, P.C.

(57) ABSTRACT

A semiconductor memory device includes a plurality of MIS transistors arranged at intersections of first word lines and bit lines formed on an SOI substrate and each configuring a memory cell. Each of the plurality of MIS transistors includes a channel body formed in a semiconductor layer on an insulating film and set in an electrically floating state, a first extension region formed in contact with the channel body in the semiconductor layer and arranged in a first word line direction, a gate insulating film formed on the channel body, a gate electrode formed on the gate insulating film and electrically connected to a corresponding one of the first word lines, and source and drain regions separately formed in a bit line direction in the semiconductor layer to sandwich the channel body.

19 Claims, 19 Drawing Sheets

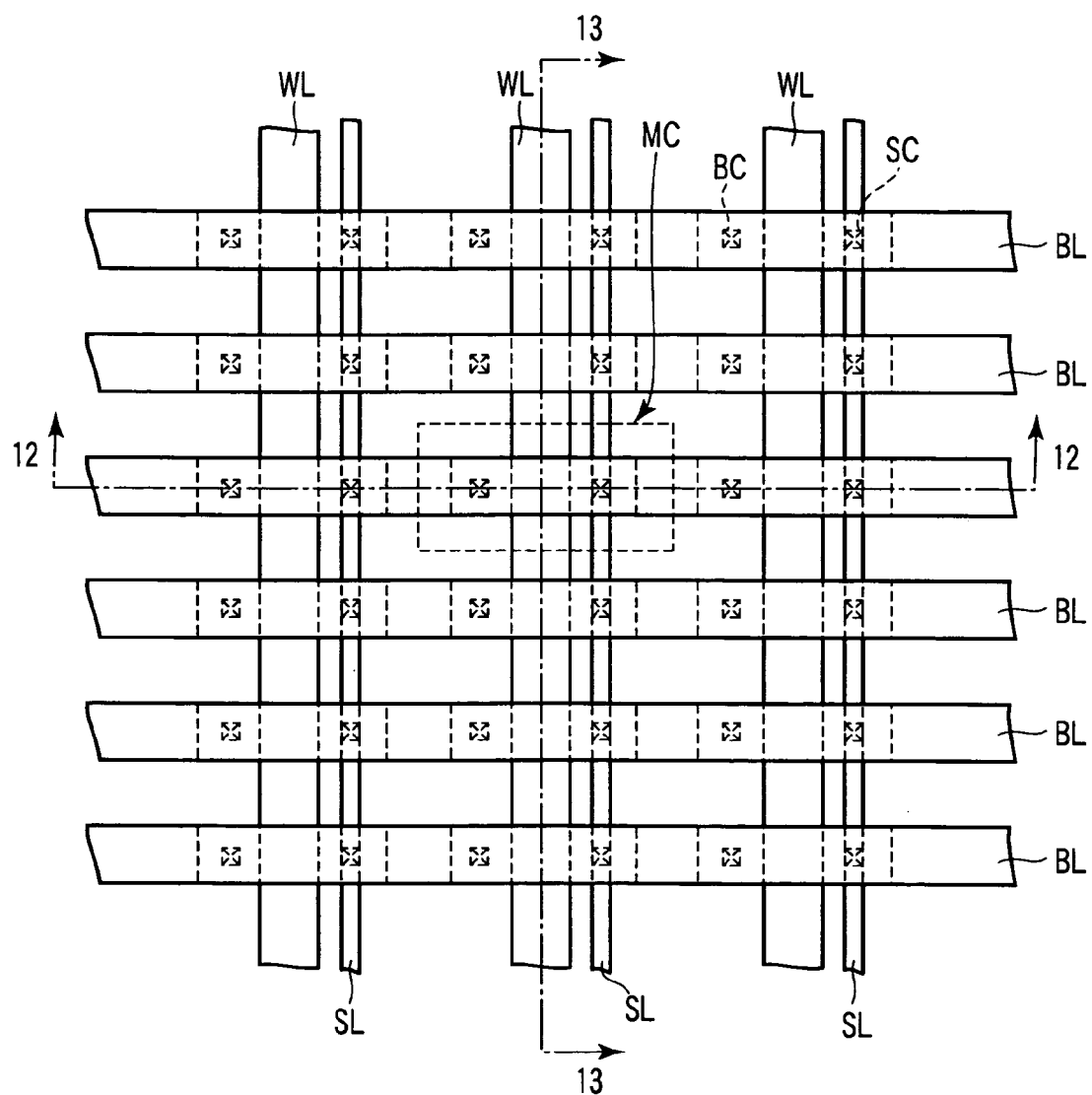
F I G. 11

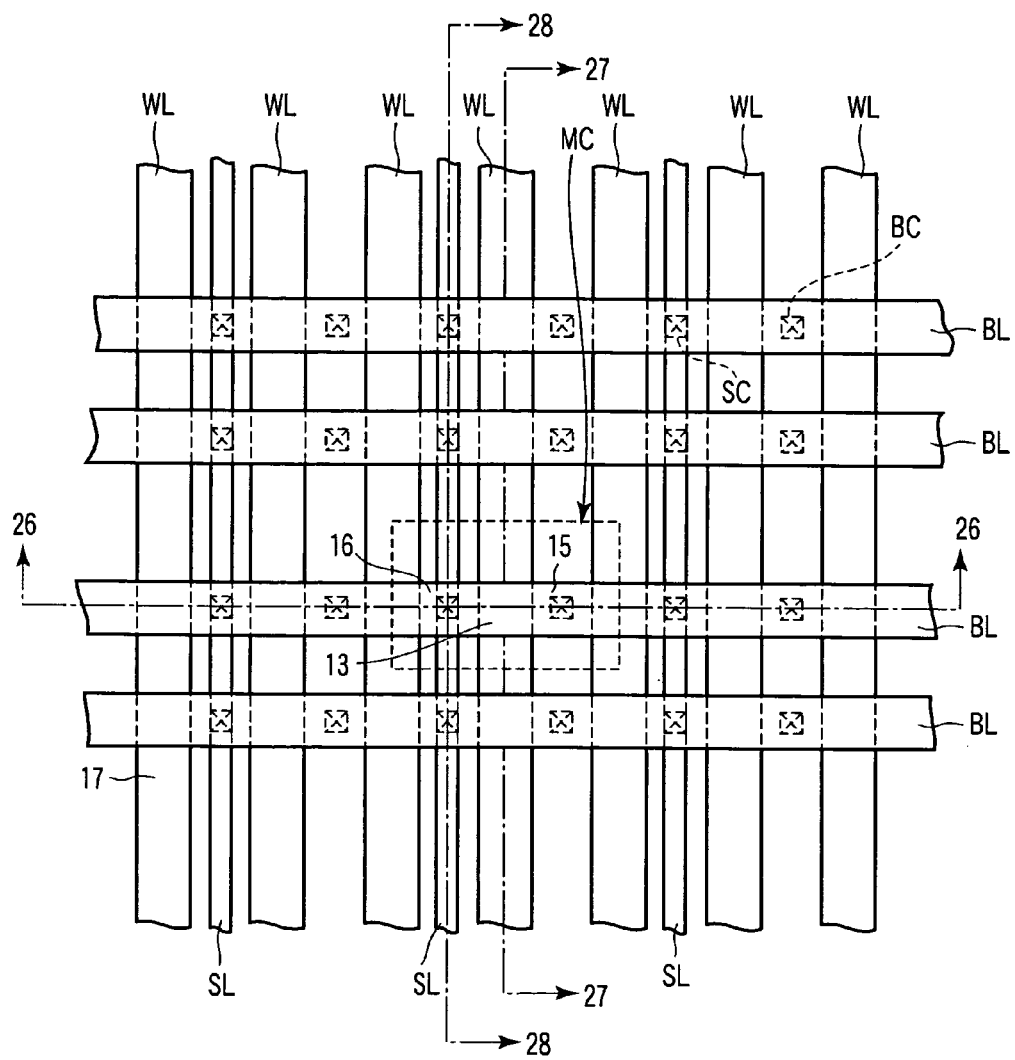
F I G. 25

SEMICONDUCTOR MEMORY DEVICE FOR DYNAMICALLY STORING DATA WITH CHANNEL BODY OF TRANSISTOR USED AS STORAGE NODE

CROSS-REFERENCE TO RELATED APPLICATIONS

This application is based upon and claims the benefit of priority from prior Japanese Patent Application No. 2003-433930, filed Dec. 26, 2003, the entire contents of which are incorporated herein by reference.

BACKGROUND OF THE INVENTION

1. Field of the Invention

This invention relates to a semiconductor memory device and more particularly to a semiconductor memory device including floating body cells (FBCs) each of which dynamically stores data with the channel body of a transistor used as a storage node.

2. Description of the Related Art

Conventionally, a general dynamic random access memory (DRAM) which is used as a memory with high integration density contains memory cells each of which is configured by one metal oxide semiconductor (MOS) transistor and one capacitor. Further, for example, an static random access memory (SRAM) contains memory cells each of which is configured by four or six MOS transistors. Thus, since the number of constituents and the cell area of the DRAM are smaller than those of the SRAM, the DRAM is widely used as a memory with high integration density. However, in order to acquire a capacitor of preset capacitance or more (several fF to several ten fF) used to store data in a limited cell area, a complicated capacitor structure of a so-called stack type or trench type is required, for example. Further, it is expected that the structure is miniaturized in future, the capacitor structure and manufacturing process become unavoidably complicated, and therefore, a problem that the manufacturing yield is lowered and the manufacturing cost rises will occur.

Therefore, a new memory which makes the capacitor required in the DRAM cell unnecessary is proposed. As the new memory which makes the capacitor unnecessary, a floating body cell (FBC) which dynamically stores data with the channel body of a transistor used as a storage node is provided. For example, one example of the array structure and the cross-sectional view of a memory cell of the FBC is shown in FIGS. 19A to 19N in Jpn. Pat. Appln. KOKAI Publication No. 2002-343886. That is, each memory cell of the FBC has one MOS transistor with the channel body used as a storage node as the basic configuration of a memory cell.

However, in the conventional semiconductor memory device disclosed in Jpn. Pat. Appln. KOKAI Publication No. 2002-343886 and the like, the design thereof becomes unreasonable in order to attain a cell area of $4F^2$ (F is determined by a design rule). More specifically, for example, since the source and drain are commonly used by adjacent cells, carriers are transferred between the channel bodies of the adjacent cells if the diffusion length of carriers (which are carriers stored in the channel body and correspond to minority carriers in the source and drain diffusion layers) in the source and drain diffusion layers becomes longer than that defined by the design rule. As a result, there occurs a possibility that data disturbance (information destruction) occurs. Further, since the high-impurity concentration layer of part of the channel body portion lies adjacent to the source and drain, the junction leak current increases and the retention characteristic may be deteriorated.

BRIEF SUMMARY OF THE INVENTION

A semiconductor memory device according to an aspect of the invention comprises first word lines, bit lines arranged to intersect the first word lines, and a plurality of MIS transistors arranged at intersections of the first word lines and bit lines and each configuring a memory cell, each of the plurality of MIS transistors includes a channel body formed in a semiconductor layer on an insulating film and set in an electrically floating state, a first extension region formed in contact with the channel body in the semiconductor layer and arranged in a direction of the first word line, a gate insulating film formed on the channel body, a gate electrode formed on the gate insulating film and electrically connected to a corresponding one of the first word lines, and source and drain regions separately formed in a direction of the bit line in the semiconductor layer to sandwich the channel body.

A semiconductor memory device according to another aspect of the invention comprises first word lines, bit lines arranged to intersect the first word lines, and a plurality of fin-gate-type transistors arranged at intersections of the first word lines and bit lines and each configuring a memory cell, each of the plurality of fin-gate-type transistors includes a channel body formed in a semiconductor layer on an insulating film and set in an electrically floating state, a gate insulating film formed on the channel body of the semiconductor layer and facing side walls thereof, a double-gate electrode formed to extend from one of the side walls of the semiconductor layer onto the semiconductor layer and the other side wall on the gate insulating film and electrically connected to a corresponding one of the first word lines, and source and drain regions separately formed in a direction of the bit line in the semiconductor layer to sandwich the channel body.

BRIEF DESCRIPTION OF THE SEVERAL VIEWS OF THE DRAWING

FIG. 11 is a plan view schematically showing a semiconductor memory device according to a fourth embodiment of this invention;

FIG. 25 is a plan view schematically showing a semiconductor memory device according to a modification 5 of this invention;

DETAILED DESCRIPTION OF THE INVENTION

There will now be described embodiments of this invention with reference to the accompanying drawings. In the explanation, common reference symbols are attached to like portions throughout the drawings.

[First Embodiment]

Figure 2:
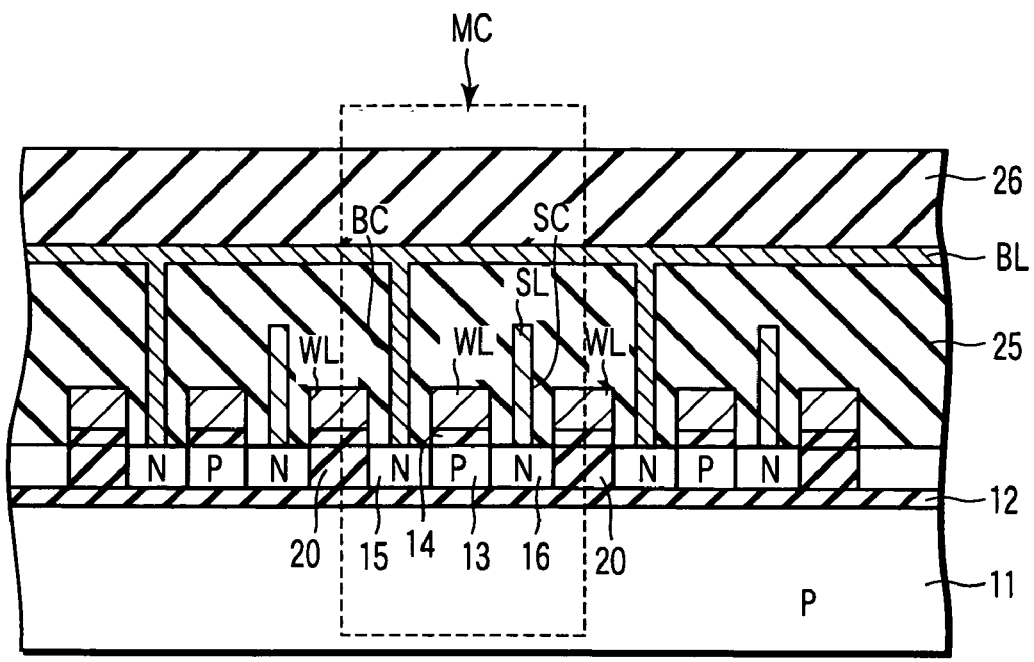
FIG. 2 is a cross-sectional view schematically showing the semiconductor memory device taken along the 2—2 line of FIG. 1 and viewed in the arrow direction.
Figure 3:
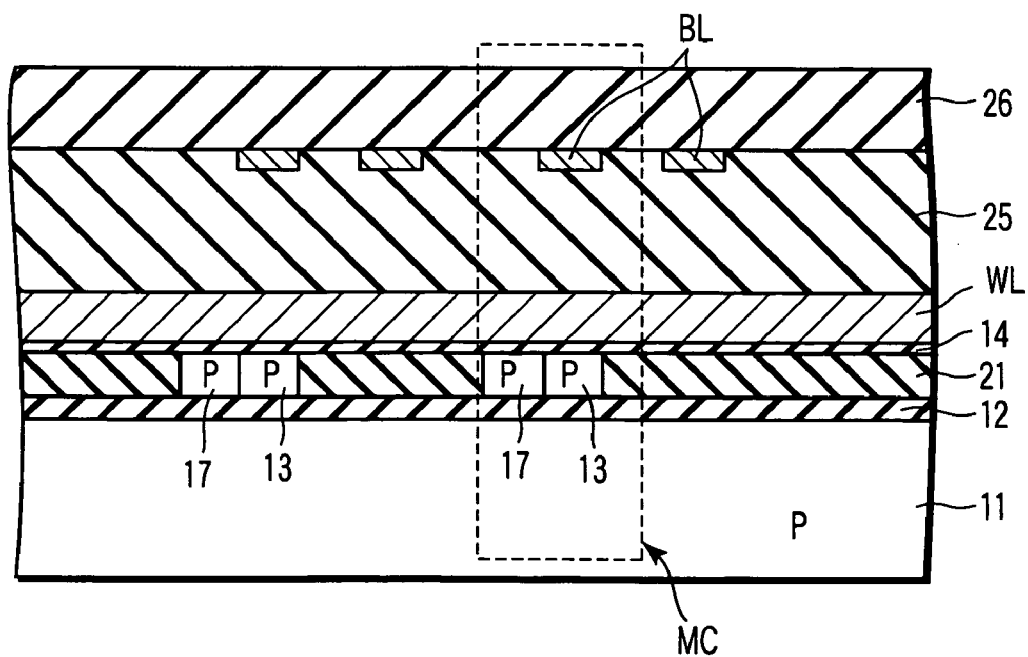
FIG. 3 is a cross-sectional view schematically showing the semiconductor memory device taken along the 3—3 line of FIG. 1 and viewed in the arrow direction.

First, a semiconductor memory device according to a first embodiment of this invention is explained with reference to FIGS. 1 to 3. The semiconductor memory device shown in FIGS. 1 to 3 is a so-called floating body cell (FBC) device and is a DRAM cell which uses the channel body of a transistor as a storage node to recognize data based on a difference in the current-voltage characteristic of the transistor caused by the potential of the storage node.

Figure 1:
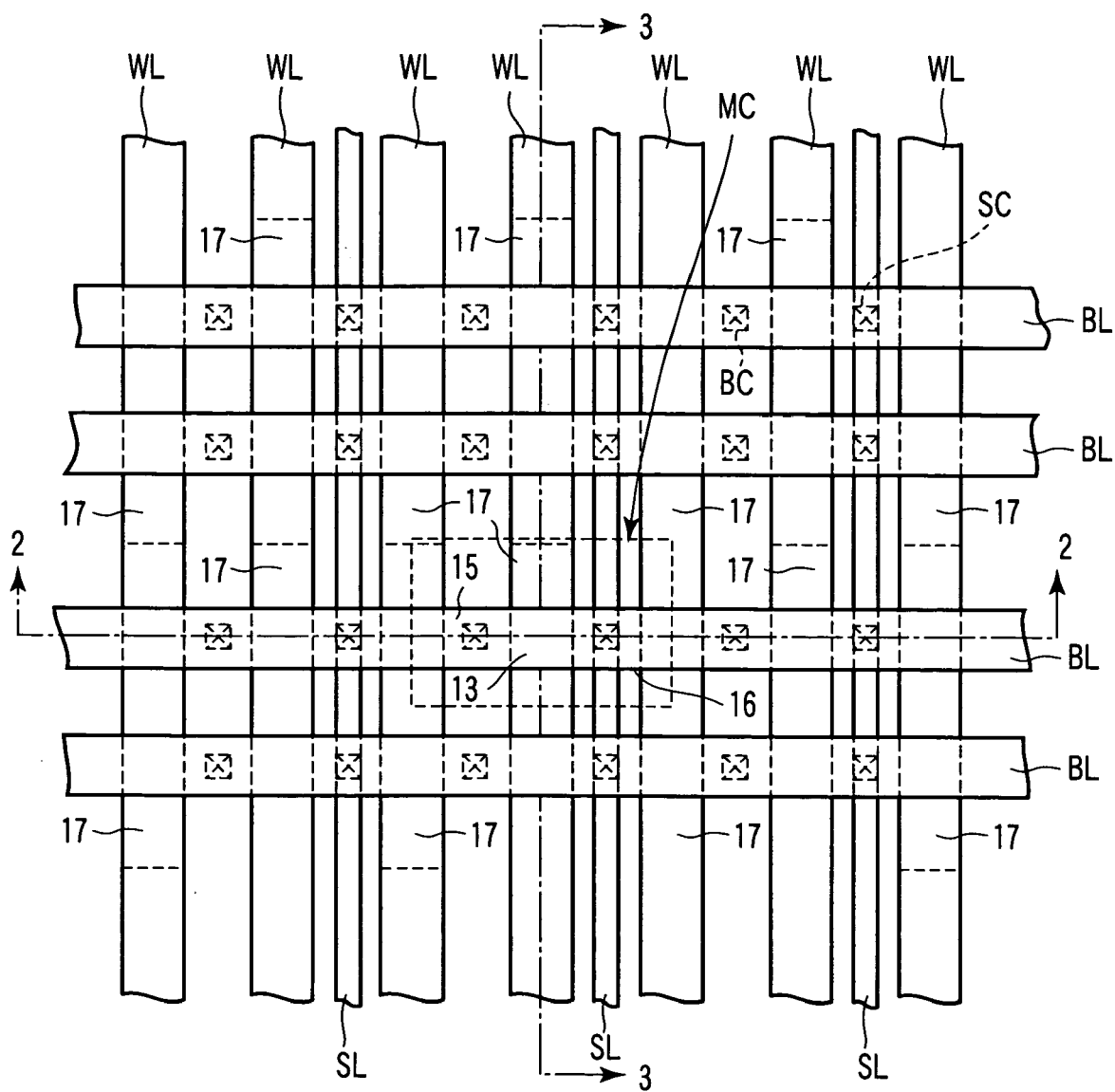
FIG. 1 is a plan view schematically showing a semiconductor memory device according to a first embodiment of this invention.

FIG. 1 is a plan view schematically showing one example of a memory cell array of the semiconductor memory device according to the first embodiment. FIG. 2 is a cross-sectional view taken along the 2—2 line of FIG. 1 and viewed in the arrow direction. FIG. 3 is a cross-sectional view taken along the 3—3 line of FIG. 1 and viewed in the arrow direction.

A portion surrounded by broken lines in FIG. 1 indicates a memory cell MC of one bit unit. The memory cells MC are respectively provided at intersections of word lines WL and bit lines BL. The dimension (cell size) of the memory cell MC of one bit unit is $10F^2$ if the minimum processing size is F. Common source lines SL are arranged in the direction of the word lines WL.

The memory cell MC is configured by an N-channel MIS transistor formed on an SOI substrate. For example, the SOI substrate is a substrate configured by forming a silicon oxide film (buried insulating film) 12 or the like as an insulating film on the main surface of a P-type silicon substrate (supporting substrate) 11 and forming a P-type silicon layer 13 as an SOI layer on the silicon oxide film 12. Therefore, since SOI elements formed on the SOI substrate are electrically isolated from the supporting substrate 11 by the buried insulating film 12 and have no junction capacitances with the substrate 11, the parasitic capacitance thereof is low and high-speed operation can be attained.

A gate electrode is formed above each P-type silicon layer 13 acting as a channel body with a gate insulating film 14 disposed therebetween. The gate electrode is formed to extend in one direction and functions as a word line WL. Further, an N-type drain region 15 and N-type source region 16 are formed to sandwich the P-type silicon layer 13.

As shown in FIGS. 1 and 3, P-type silicon layers (extension regions) 17 extending in the word line direction are formed adjacent to the respective P-type silicon layers 13. That is, the channel body is formed of the P-type silicon layer 13 and P-type silicon layer 17. As shown in FIG. 1, the P-type silicon layers 17 of the respective memory cells MC are alternately arranged in a zigzag form along the bit line BL.

The drain region 15 and source region 16 are formed to reach the depth of the silicon oxide film 12. Further, portions of the channel body formed of the P-type silicon layers 13 and 17 in the channel width direction (in a direction along the word line WL) are insulated by an inter-level insulating film 21 such as a silicon oxide film. Therefore, the bottom surface and the side surfaces in the channel width direction of the channel body formed of the P-type silicon layers 13 and 17 are electrically isolated from the surrounding portions. Further, portions of the channel body in the channel length direction are electrically isolated by the PN junction and the channel body is set in an electrically floating state.

As shown in FIG. 2, an element isolation film 20 is formed between the memory cells MC which are adjacent in the direction of the bit line BL and thus the adjacent cells are electrically isolated.

Further, the word lines WL are formed on the element isolation films 20. Each word line WL is a so-called passing word line and is not used to directly operate the memory cell MC in the cross section. Thus, when attention is given to one bit line BL, the word lines and the passing word lines (passage word lines) are alternately arranged.

Bit line contacts BC are formed in the inter-level insulating film 25 to electrically connect the drain regions 15 to the respective bit lines BL. Further, common source line contacts SC are formed in the inter-level insulating film 25 to electrically connect the source regions 16 to the respective common source lines SL. An inter-level insulating film 26 is formed on the bit lines BL to cover the memory cells MC.

Next, one example of the operation of the memory cell with the above configuration is briefly explained. The write/read operation of the memory cell MC is performed by utilizing storage/discharging of excessive holes which are majority carriers of the channel body (the P-type silicon layers 13 and 17 which are electrically isolated from the other portion). In the following explanation, it is assumed that a preset fixed potential (for example, approximately 0 V) is applied to the common source lines SL and common source line contacts SC.

First, the write operation is explained. A high potential is applied to the word line WL so that the cell transistors of the memory cells MC can turned on. Then, a high potential is applied to the bit line BL to cause impact ionization in a portion near the drain region 15. Holes which are majority carriers are stored or accumulated in the channel body by the impact ionization. At this time, it is desirable to apply a negative potential to the substrate 11 to capacitively store the holes in the channel body via the silicon oxide film 12. Thus, the channel body is set to hold excessive holes. If the excessive hole storing state is set to a "1" state, for example, the "1" state writing operation (write operation) can be performed. On the other hand, a high potential is applied to the word line WL and a negative potential is applied to the bit line BL to bias the PN junction between the drain region 15 and the channel body in a forward direction and discharge excessive holes into the drain region 15. Thus, a "0" state writing operation (erase operation) can be performed. The "1", "0" states are stored as the potential difference in the channel body, that is, the difference in the threshold voltages of the cell transistor.

Next, the read operation is explained. A certain voltage (for example, approximately 0.1 to 0.2 V when the voltage applied to the source region is approximately 0 V) which does not cause impact ionization is applied to the bit line BL and a high potential is applied to the word line WL to turn on the cell transistor of the memory cell MC. At this time, different currents flow in the bit line BL in the "1" state and "0" state. For example, the difference in the current is differentially amplified and detected by use of a current-voltage conversion circuit or the like to read the "1" state or "0" state of the memory cell MC.

In the holding state, in order to continuously hold the "1" state, it is necessary to continuously apply the negative potential to the word line WL and lower the potential of the channel body so that the memory cell will not be disturbed when the erase operation for the other memory cells which are connected to the same bit line is performed. The "0" state transits to the "1" state while holes are being stored by a current generated from the junction between the channel and the source or drain. However, it is possible to maintain the state for a sufficiently long time by reducing the junction area or increasing the capacitance of the channel body.

If the "0" state writing operation (erase operation) is not performed, the state in which the "1" state is held is kept unchanged in principle even when the read operation is performed. Also, if the "1" state writing operation (write operation) is not performed, the "0" state is kept unchanged in principle even when the read operation is performed. That is, unlike the DRAM having one transistor/one capacitor and utilizing the charge storage function of the capacitor, a non-destructive readout operation can be performed within at least a preset period.

As explained above, the P-type silicon layers 17 which are connected to the P-type silicon layers 13 and formed to extend in the word line direction are provided. That is, the channel body is configured by the P-type silicon layers 13 and 17. Thus, the channel body portion which is isolated from the source region 16 and drain region 15 on a plane can be provided by forming the P-type silicon layer 17 which extends in the word line direction. Therefore, the channel body can be formed adjacent to the source region and drain region and the body capacitance can be increased while the junction leak current is prevented from increasing. As a result, the signal amount can be increased and the retention characteristic can be enhanced.

Further, the element isolation film 20 is formed between the memory cells MC which are adjacent in the direction of the bit line BL. Therefore, the memory cells MC which are adjacent in the direction of the bit line BL can be separated and electrically isolated from each other. Thus, an electrically isolated structure is provided in which the memory cells MC which are adjacent in the direction of the bit line BL do not commonly use the source region 16 and drain region 15. Therefore, even if the diffusion length of carriers in the source and drain diffusion layers becomes larger than the length defined by the design rule, carriers can be prevented from being transferred between the channel bodies of the adjacent cells. As a result, occurrence of data disturbance (information destruction) can be prevented and the reliability can be enhanced.

The P-type silicon layers 17 of the memory cells MC are arranged in a zigzag form along the bit lines BL. In other words, the directions of the P-type silicon layers 17 of the memory cells MC which are adjacent along the bit lines BL are reversed for each row. With the memory cell array arrangement described above, a fine pattern arrangement can be attained and the pattern occupied area can be reduced.

Further, as shown in FIG. 1, the memory cell array structure according to the present embodiment is an array structure of a so-called folded bit line configuration in which memory cells adjacent in the word line WL direction are deviated by one cell in the bit line BL direction (in this example, they are rotated by 180 degrees and deviated). Therefore, when attention is given to one bit line BL, the word lines and the passing word lines are alternately arranged.

As a result, when a certain word line WL is selected at the time of access to the memory cell MC, access can be made only to the memory cells MC for every other bit line BL. Therefore, circuits (such as current-voltage conversion circuits, sense amplifiers or the like) which transfer data with respect to the cell via the bit line BL may be arranged to activate every other bit lines BL. As a result, the arrangement can be attained without using the strict design rule and stable circuit operation can be performed.

Further, the common source lines SL are arranged in the word line WL direction. Therefore, a preset fixed potential applied to the source region 16 of each memory cell MC can be uniformly controlled in the cell array. As a result, stable memory operation can be performed and the reliability can be enhanced.

The above structures are disposed on the silicon oxide film (buried insulating layer) 12. Therefore, after the SOI substrate is once formed, it is not necessary to form a new structure on the silicon substrate (supporting substrate) 11 and silicon oxide film 12. Thus, the manufacturing process can be simplified and the manufacturing cost can be lowered.

Further, by forming the silicon oxide film (buried insulating film) 12 to have a sufficiently small thickness, a substantial capacitance can be formed between the silicon substrate (supporting substrate) 11 to which a fixed potential is applied and the channel body (P-type silicon layers 13, 17) and the ratio of the above capacitance to the capacitance between the channel body and the drain region 15 can be limited. Therefore, the operation of the memory cell MC can be further stabilized and the manufacturing yield and the reliability can be enhanced.

[Second Embodiment]

Next, a semiconductor memory device according to a second embodiment of this invention is explained with reference to FIGS. 4 to 6. In the following explanation, the repetitive explanation for the same portion as that of the first embodiment is omitted.

Figure 4:
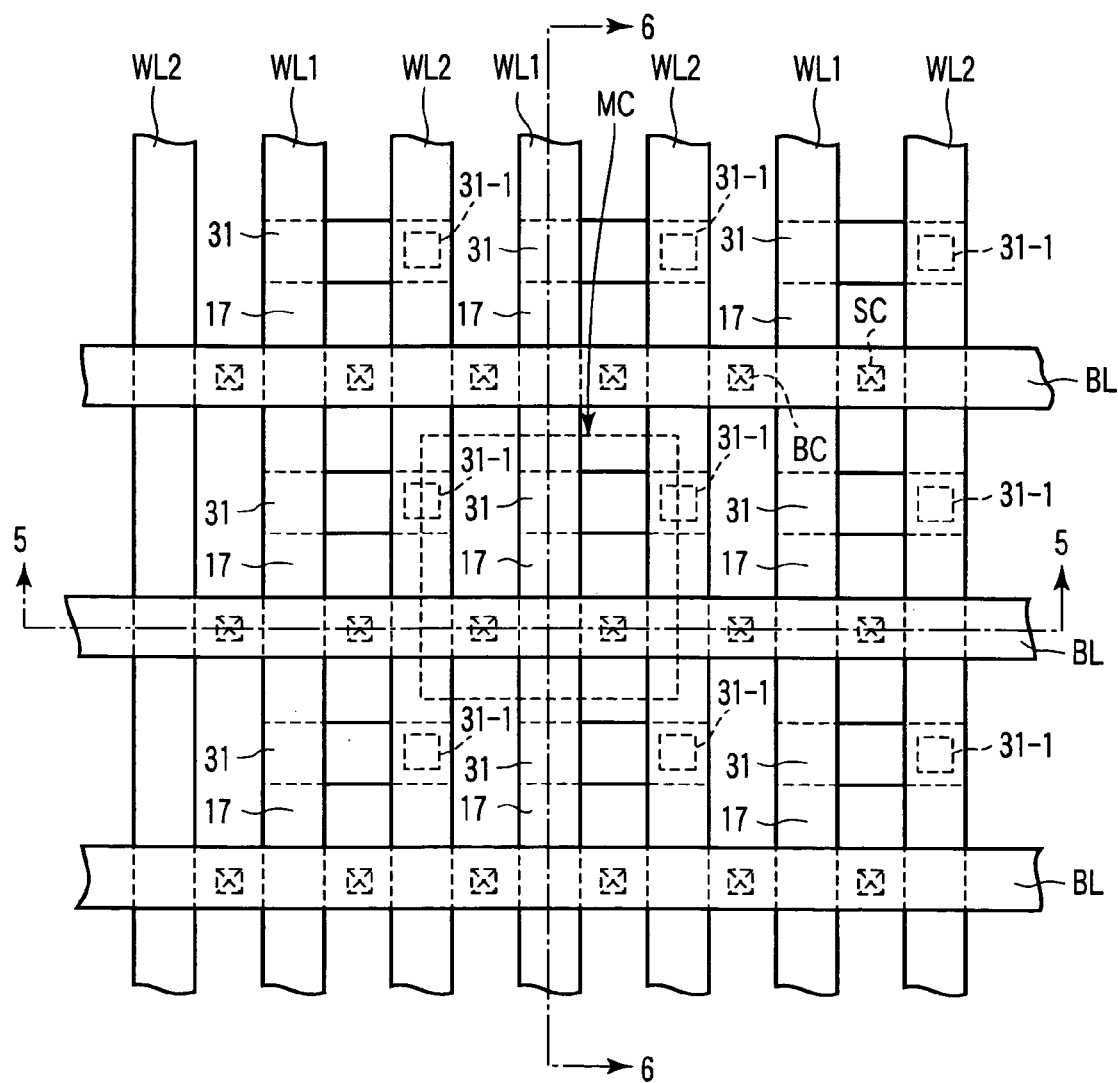
FIG. 4 is a plan view schematically showing a semiconductor memory device according to a second embodiment of this invention.

FIG. 4 is a plan view schematically showing one example of the semiconductor memory device according to the second embodiment. FIG. 5 is a cross-sectional view taken along the 5—5 line of FIG. 4 and viewed in the arrow direction. FIG. 6 is a cross-sectional view taken along the 6—6 line of FIG. 4 and viewed in the arrow direction.

Figure 5:
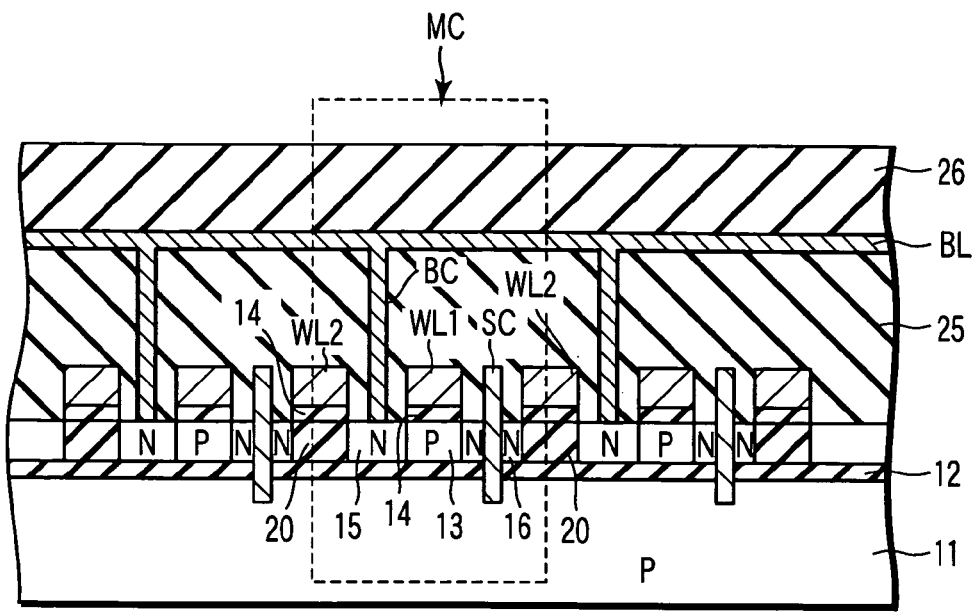
FIG. 5 is a cross-sectional view schematically showing the semiconductor memory device taken along the 5—5 line of FIG. 4 and viewed in the arrow direction.
Figure 6:
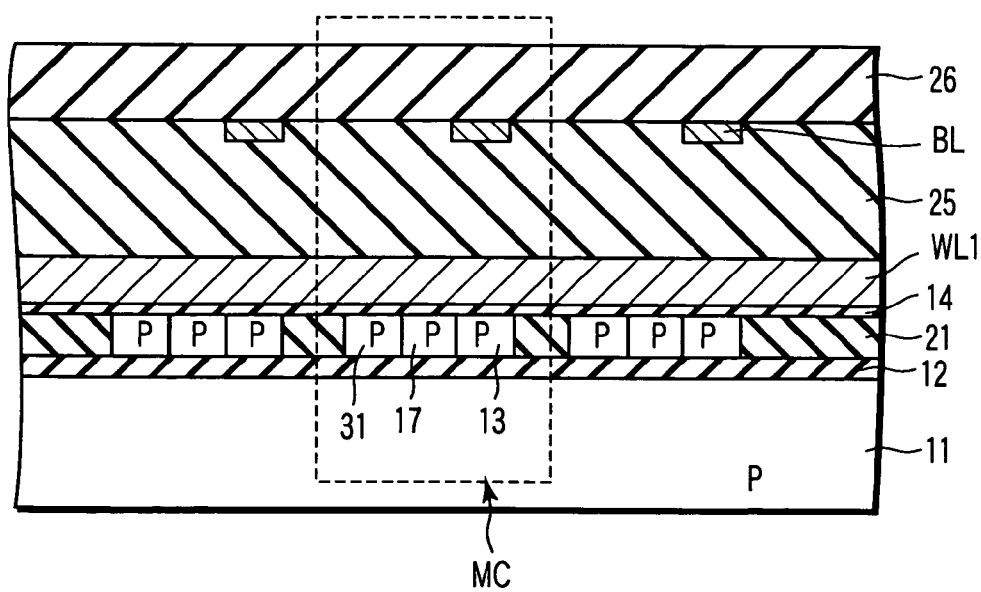
FIG. 6 is a cross-sectional view schematically showing the semiconductor memory device taken along the 6—6 line of FIG. 4 and viewed in the arrow direction.

As shown in FIGS. 4 to 6, memory cells MC are arranged at intersections of first word lines WL1 and bit lines BL. The memory cell MC surrounded by broken lines in FIG. 4 indicates one bit unit and the cell size is $16F^2$. Second word lines WL2 are arranged adjacent to the respective first word lines WL1 and formed to extend in the above direction. In other words, adjacent word lines of one pair configure the first word line WL1 and second word line WL2.

As shown in FIGS. 4 and 6, P-type silicon layers (extension regions) 17 extending in the first word line WL1 direction are formed adjacent to respective P-type silicon layers 13. Further, P-type silicon layers (extension regions) 31 extending in the bit line BL direction and connected to the respective second word lines WL2 adjacent to the first word liens WL1 are formed adjacent to the respective P-type silicon layers 17. That is, the channel body is formed of the P-type silicon layers 13, 17 and 31.

Further, as shown in FIG. 4, it is desirable to form inversion preventing layers 31-1 on interfaces between the second word lines WL2 and the P-type silicon layers 31. The inversion preventing layer 31-1 is formed of a $P^+$-type silicon layer having an impurity concentration higher than that of the P-type silicon layer 31. Further, the impurity concentration of the inversion preventing layer 31-1 is set to a high impurity concentration which prevents a channel inversion layer from being formed by the potential applied by the second word lines WL2.

Source contacts SC are formed to penetrate through source regions 16 and a buried insulating film 12 and are disposed on the surface of the supporting substrate 11. More preferably, it is desirable to form high-impurity concentration layers on the contact portions of the supporting substrate 11.

With the above configuration, an effect the same as that of the first embodiment can be attained. Further, the second word lines WL2 are formed adjacent to the respective first word lines WL1 in the first word line WL1 direction. Therefore, sufficient capacitive coupling with respect to the channel body (P-type silicon layers 13, 17, 31) can be attained by applying a desired potential to the second word line WL2. That is, the channel body potential can be independently controlled by increasing the amount of charges stored in the channel body and by use of the second word line WL2. As a result, the retention characteristic can be enhanced and stable operation of the memory cell MC can be realized.

Further, the inversion preventing layer 31-1 is formed on each of the interfaces between the second word lines WL2 and the P-type silicon layers 31. Therefore, when a desired potential is applied to the second word line WL2, the capacitance between the second word line WL2 and the P-type silicon layer 31 can be stably acquired without forming the channel inversion layer on the interface between the second word line WL2 and the P-type silicon layer 31.

Since the second word lines WL2 are formed on the surface of the SOI layer, they can be easily formed on the SOI layer surface side. In other words, it is not necessary to form them in the supporting substrate 11. Thus, since the memory can be easily manufactured, the manufacturing cost can be lowered and the operation margin and the manufacturing yield can be enhanced.

Further, the P-type silicon layers 31 which are connected to the respective P-type silicon layers 17, extend in the bit line BL direction and are connected to the second word lines WL2 adjacent to the first word lines WL1. That is, the channel body includes the P-type silicon layer 31 which is further isolated from the source region 16 and drain region 15. Therefore, the junction leak current is further reduced and the retention characteristic can be enhanced.

The source contacts SC are formed to penetrate through the source regions 16 and buried insulating film 12 and are disposed on the surface of the supporting substrate 11. That is, the source line is not provided and a potential is applied to each source via the substrate 11 (or silicon layer 61). Particularly, when the SOI layer is formed to have a large film thickness, the contact area with the source region 16 of each memory cell MC can be increased and the source resistance can be lowered by the contact portion on the side surface of the penetration SOI layer with the source contact SC and source region 16. Therefore, the operation of the memory cell MC can be stabilized. Further, the common source lines SL as shown in FIG. 1 can be made unnecessary by forming the above contact portion and the wiring configuration can be simplified.

[Third Embodiment]

Next, a semiconductor memory device according to a third embodiment of this invention is explained with reference to FIGS. 7 to 9. In the following explanation, the repetitive explanation for the same portion as that of the first and second embodiments is omitted.

Figure 7:
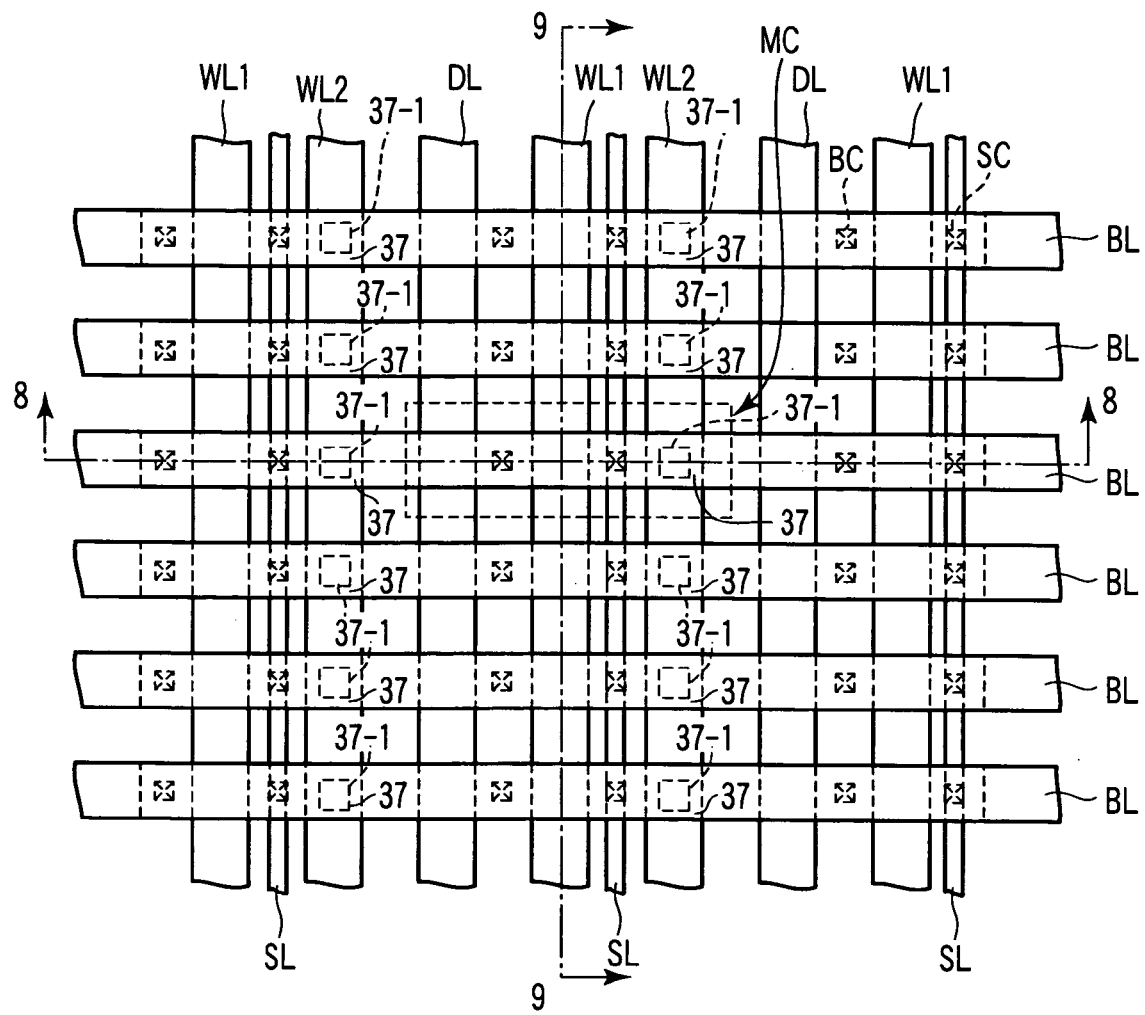
FIG. 7 is a plan view schematically showing a semiconductor memory device according to a third embodiment of this invention.

FIG. 7 is a plan view schematically showing one example of the semiconductor memory device according to the third embodiment. FIG. 8 is a cross-sectional view schematically showing the semiconductor memory device taken along the 8—8 line of FIG. 7 and viewed in the arrow direction. FIG. 9 is a cross-sectional view schematically showing the semiconductor memory device taken along the 9—9 line of FIG. 7 and viewed in the arrow direction.

Figure 8:
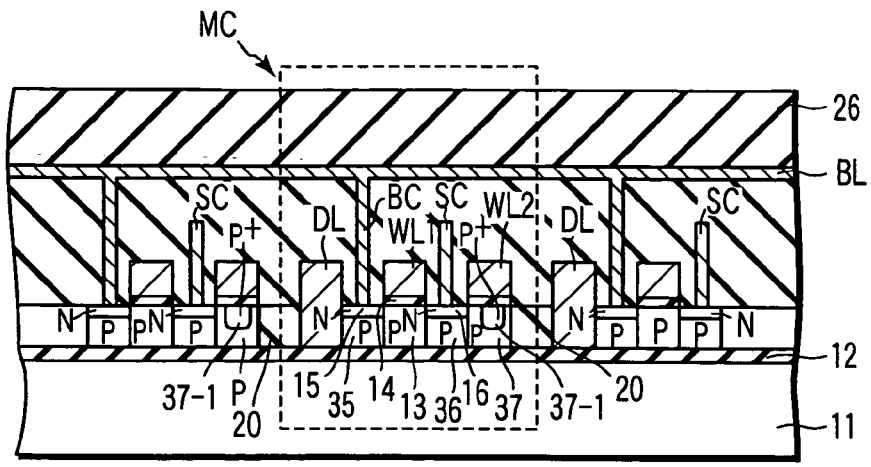
FIG. 8 is a cross-sectional view schematically showing the semiconductor memory device taken along the 8—8 line of FIG. 7 and viewed in the arrow direction.
Figure 9:
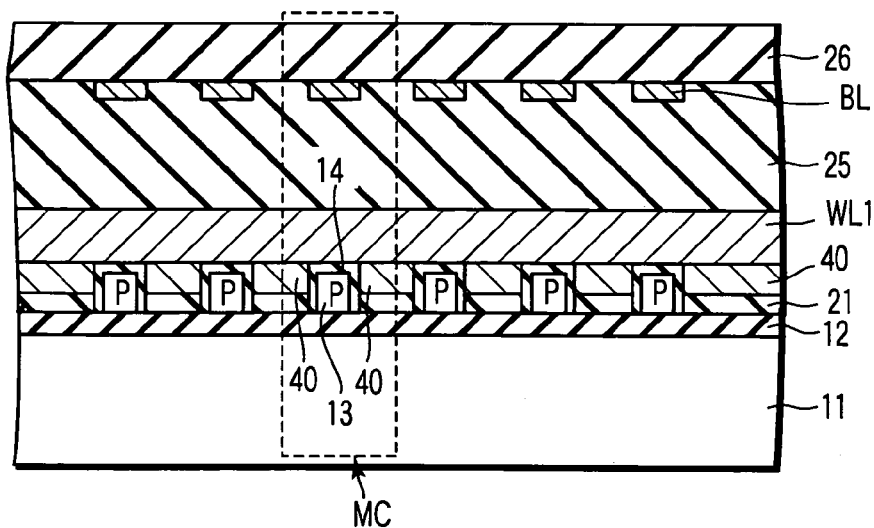
FIG. 9 is a cross-sectional view schematically showing the semiconductor memory device taken along the 9—9 line of FIG. 7 and viewed in the arrow direction.

As shown in FIGS. 7 to 9, memory cells MC are arranged at intersections of first word lines WL1 and bit lines BL. The memory cell MC surrounded by broken lines in FIG. 7 indicates one bit unit and the cell size is $12F^2$. Second word lines WL2 and dummy word lines DL are arranged adjacent to the respective first word lines WL1 and formed to extend in the first word line WL1 direction.

As shown in FIG. 8, P-type silicon layers (extension regions) 35 are formed adjacent to respective P-type silicon layers 13 between drain regions 15 and an insulating film 12. Further, P-type silicon layers (extension regions) 36 are formed adjacent to the respective P-type silicon layers 13 between the source regions 16 and the insulating film 12. P-type silicon layers (extension regions) 37 are formed adjacent to the respective P-type silicon layers 36 between the gate insulating films 14 of the second word lines WL2 and the insulating film 12. That is, the channel body is formed of the P-type silicon layers 35, 13, 36 and 37 which are formed below the bit lines BL in the bit line BL direction.

Further, as shown in FIG. 8 or 9, it is desirable to form inversion preventing layers 37-1 on interfaces between the second word lines WL2 and the P-type silicon layers 37. The inversion preventing layer 37-1 is formed of a $P^+$-type silicon layer having impurity concentration higher than that of the P-type silicon layer 37. Further, the impurity concentration of the inversion preventing layer 37-1 is set to a high impurity concentration which prevents a channel inversion layer from being formed by the potential applied by a second gate.

As shown in FIG. 9, double-gates 40 connected to the word lines WL1 are formed to sandwich the respective P-type silicon layers 13 with the gate insulating films 14 disposed therebetween. That is, each memory cell MC has a fin-gate-type double-gate transistor structure.

With the above configuration, the same effect as that described above can be attained. Further, the channel body is formed of the P-type silicon layers 35, 13, 36 and 37 which are formed below the bit lines BL in the bit line BL direction. Therefore, the second word line WL2 can be connected to the channel body without increasing the cell occupied area in the word line WL1, WL2 direction.

Further, as shown in FIG. 9, the double-gates 40 formed adjacent to the first word lines WL1 are formed to sandwich the respective P-type silicon layers 13 with the gate insulating films 14 disposed there-between. Therefore, each memory cell MC has a fin-gate-type double-gate transistor structure. With the above configuration, channels can be formed not only on the interface on the upper surface of the P-type silicon layer 13 but also on the interfaces on both side surfaces of the P-type silicon layer 13 sandwiched by the double-gates 40 with the gate insulating films 14 disposed therebetween. Therefore, the current flowing in the channel can be increased and this is effective because the high-speed operation can be attained along with miniaturization.

Further, the capacitance ratio can be adjusted by providing the fin-gate-type double-gate transistor structure as described above. More specifically, with the above configuration, the ratio of the capacitances between the channel body and the drain region 15 and source region 16 can be reduced when a so-called SOI layer is applied.

Further, the dummy word liens DL are formed along the first word line WL1 direction. Therefore, the memory cells MC which are adjacent in the bit line BL direction are isolated by the element isolation film 20 and dummy word line DL. Thus, the second word line WL2 and drain region 15 which can have applied a high voltage are isolated on a plane. As a result, occurrence of a connection leak current between the second word line WL2 and drain region 15 can be prevented and the retention characteristic can be enhanced. Further, even when a P-type high-impurity concentration diffusion layer is formed on the channel body as required, the retention characteristic can be enhanced by the same function.

The semiconductor device according to this embodiment is not limited to the fin-gate-type double-gate transistor that has double-gate 40 provided on the sides of the P-type silicon layer 13, respectively. The device may be a fin-gate-type triple-gate transistor in the fin-gate-type, triple-gate transistor, two gates are provided on the sides of the P-type silicon layer 13, and the remaining gate is provided on a gate-insulating film 14 formed on the P-type silicon layer 13. That is, the device may be a so called fin-gate-type transistor (FINFET).

[Modification 1]

Next, a semiconductor memory device according to a modification of the third embodiment of this invention is explained with reference to FIG. 10. In the following explanation, the repetitive explanation for the same portion as that of the first embodiment is omitted.

Figure 10:
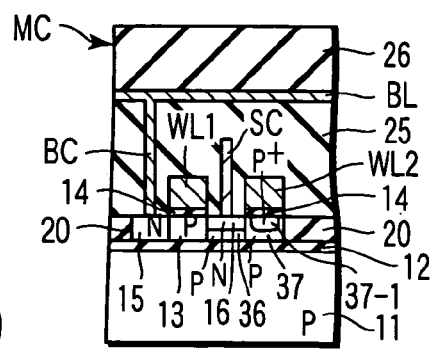
FIG. 10 is a cross-sectional view schematically showing a semiconductor memory device according to a modification 1 of this invention.

FIG. 10 is a cross-sectional view schematically showing a memory cell MC of one bit unit according to the modification of the third embodiment. The memory cell array structure of the present modification is the same as the structure of FIG. 7 from which the dummy word lines DL are removed. Further, the cross-sectional structure as viewed in the word line WL1 direction is the same as the structure of FIG. 9 from which the double-gates 40 are removed.

As shown in FIG. 10, a P-type silicon layer (extension region) 36 is formed adjacent to a P-type silicon layer 13 between the source region 16 and the insulating film 12. A P-type silicon layer (extension region) 37 is formed adjacent to the P-type silicon layer 36 between the gate insulating film 14 of the second word line WL2 and the insulating film 12. That is, the channel body is configured by the P-type silicon layers 13, 36 and 37 formed below the bit lines BL in the bit line BL direction. In other words, the drain region 15 is formed to reach the depth of the buried insulating film 12. Further, the source region 16 is formed to shallow depth so as not to reach the buried insulating film 12 and the P-type silicon layer 36 is formed between the source region 16 and the buried insulating film 12.

It is desirable to form an inversion preventing layer 37-1 on the interface between the second word line WL2 and the P-type silicon layer 37. The inversion preventing layer 37-1 is formed of a $P^+$-type silicon layer having an impurity concentration higher than that of the P-type silicon layer 37. Further, the impurity concentration of the inversion preventing layer 37-1 is set to a high impurity concentration which prevents a channel inversion layer from being formed by the potential applied by a second gate.

With the above configuration, the same effect as that of the third embodiment can be attained. Further, the channel body is formed of the P-type silicon layers 13, 36 and 37 which are formed below the bit lines BL in the bit line BL direction. Therefore, the parasitic capacitance between the drain region 15 and the channel body can be reduced. Further, the potential of the channel body in the operation of the memory cell MC can be stabilized and the operation margin can be enhanced. Thus, since the capacitance ratio between the channel body and the bit line BL connected to the drain region 15 can be reduced, the capacitance ratio can be easily adjusted even when a so-called planar type MIS transistor structure is used instead of the fin-gate-type double-gate transistor structure.

Further, the source region 16 is formed to a shallow depth so as not to reach the buried insulating film 12 and the P-type silicon layer 36 is formed between the source region 16 and the buried insulating film 12. Therefore, even if it is difficult to sufficiently reduce the film thickness of the buried insulating film 12, a sufficiently large capacitance of the channel body can be acquired without increasing the cell area.

[Fourth Embodiment]

Next, a semiconductor memory device according to a fourth embodiment of this invention is explained with reference to FIGS. 11 to 13. In the following explanation, the repetitive explanation for the same portion as that of the above embodiments is omitted.

FIG. 11 is a plan view schematically showing one example of a memory cell array of the semiconductor memory device according to the fourth embodiment. FIG. 12 is a cross-sectional view taken along the 12—12 line of FIG. 11 and viewed in the arrow direction. FIG. 13 is a cross-sectional view taken along the 13—13 line of FIG. 11 and viewed in the arrow direction.

Figure 12:
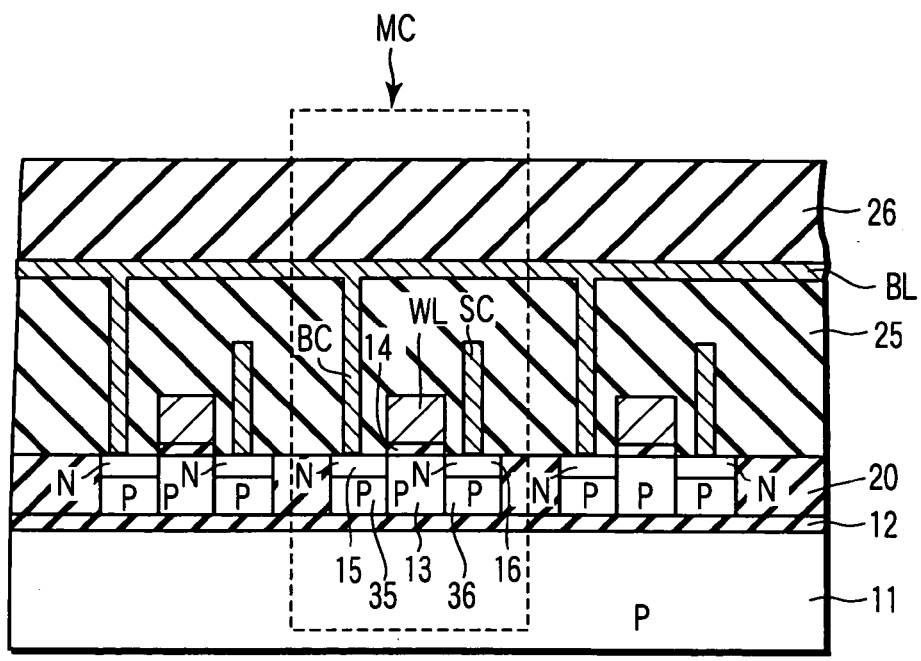
FIG. 12 is a cross-sectional view schematically showing the semiconductor memory device taken along the 12—12 line of FIG. 11 and viewed in the arrow direction.
Figure 13:
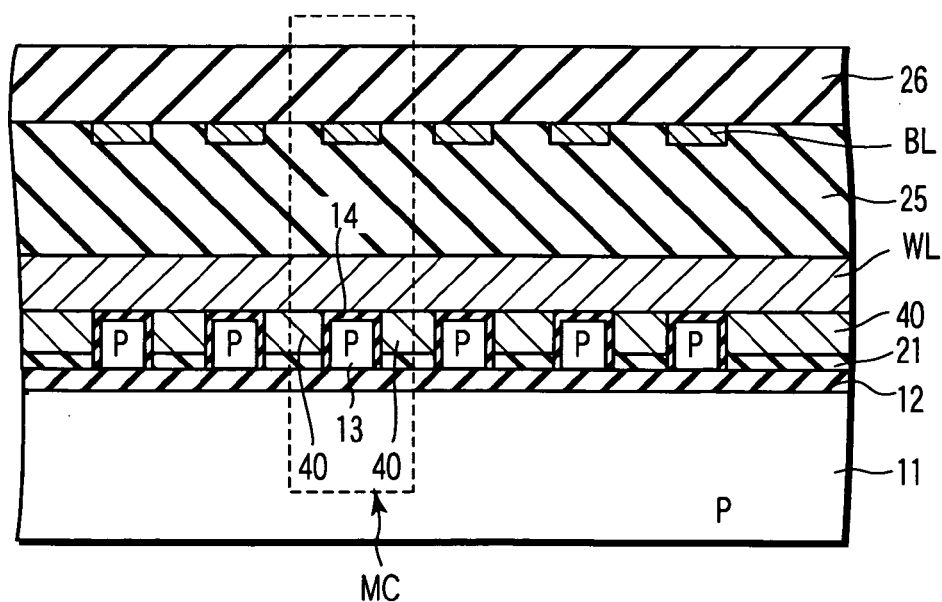
FIG. 13 is a cross-sectional view schematically showing the semiconductor memory device taken along the 13—13 line of FIG. 11 and viewed in the arrow direction.

As shown in FIGS. 11 to 13, memory cells MC are arranged at intersections of word line WL and bit lines BL. The memory cell MC surrounded by broken lines in FIG. 11 indicates one bit unit and the cell size is $8F^2$.

As shown in FIG. 11, common source lines SL connected to respective source contacts are formed in the word line WL direction. A fixed potential is applied to the common source line SL.

As shown in FIG. 12, P-type silicon layers (extension regions) 35 are formed adjacent to respective P-type silicon layers 13 between drain regions 15 and an insulating film 12. Further, P-type silicon layers (extension regions) 36 are formed adjacent to the respective P-type silicon layers 13 between source regions 16 and the insulating film 12. That is, the channel body is formed of the P-type silicon layers 13, 35 and 36 which are formed below the bit lines BL in the bit line BL direction. In other words, the drain region 15 and source region 16 are formed to a shallow depth so as not to reach the buried insulating film 12 and the P-type silicon layers 35 and P-type silicon layers 36 are respectively formed between the buried insulating film 12 and the drain regions 15 and source regions 16.

As shown in FIG. 13, double-gates 40 connected to the word lines WL are formed to sandwich the respective P-type silicon layers 13 with the gate insulating films 14 disposed therebetween. Thus, each memory cell MC has a fin-gate-type double-gate transistor structure. Further, it is desirable to form a P-type high-impurity concentration layer on the bottom portion of each channel body.

With the above configuration, the same effect as that of the above embodiments can be attained. Further, according to the configuration of the channel body, the whole capacitance of the channel body can be increased. In addition, since the memory cell MC has the fin-gate-type double-gate transistor structure, the current density can be reduced and the memory cell can be effectively miniaturized.

Further, the punch-through current can be reduced at the time of application of a voltage to the word line WL by forming the P-type high-impurity-concentration layer on the bottom portion of the channel body.

The semiconductor device according to this embodiment is not limited to the fin-gate-type double-gate transistor that has double-gate 40 provided on the sides of the P-type silicon layer 13, respectively. The device may be a fin-gate-type triple-gate transistor in the fin-gate-type, triple-gate transistor, two gates are provided on the sides of the P-type silicon layer 13, and the remaining gate is provided on a gate-insulating film 14 formed on the P-type silicon layer 13. That is, the device may be a so called fin-gate-type transistor (FINFET).

[Modification 2]

Next, a semiconductor memory device according to a modification of the first embodiment is explained with reference to FIGS. 14 to 16. In the following explanation, the repetitive explanation for the same portion as that of the first embodiment is omitted.

Figure 14:
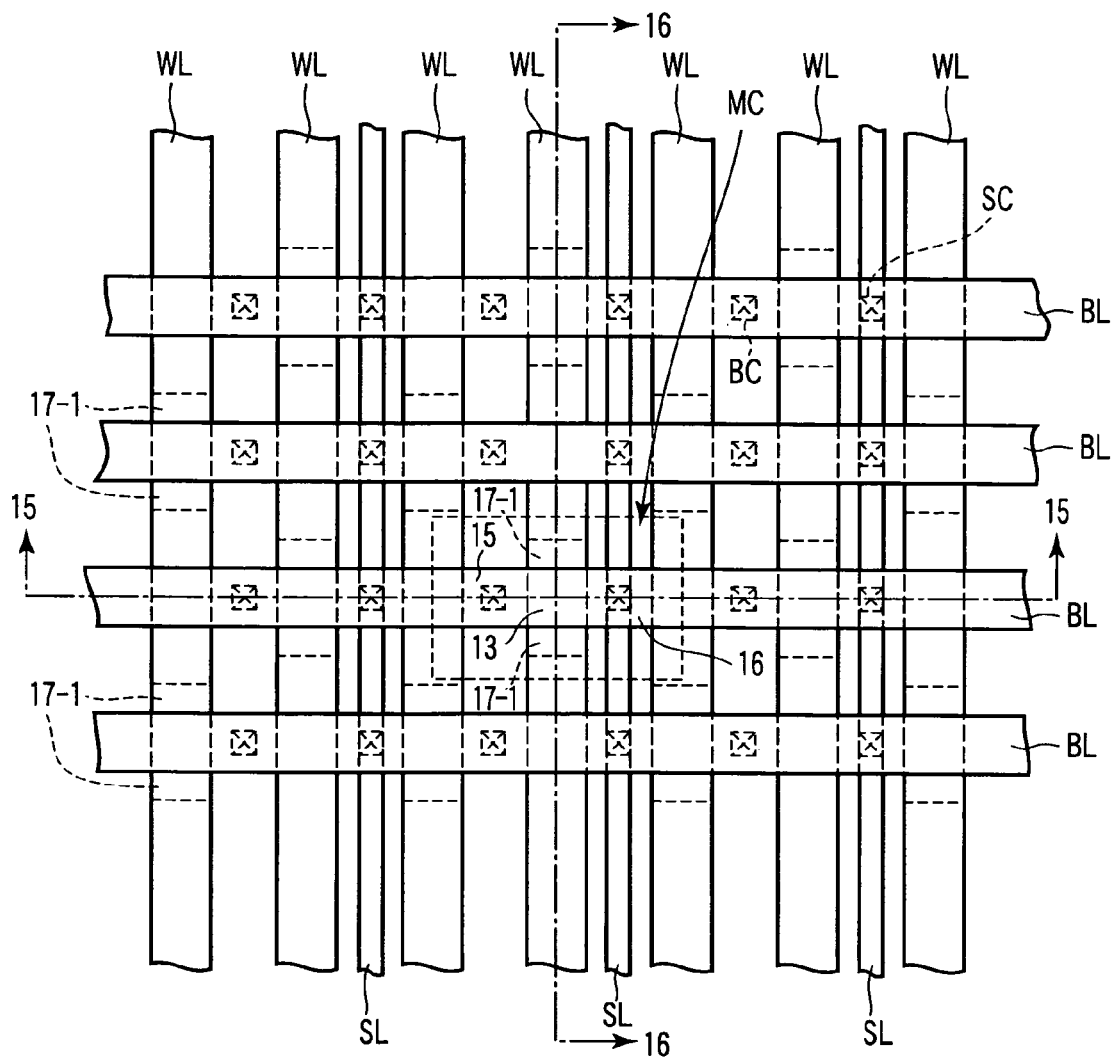
FIG. 14 is a plan view schematically showing a semiconductor memory device according to a modification 2 of this invention.
Figure 15:
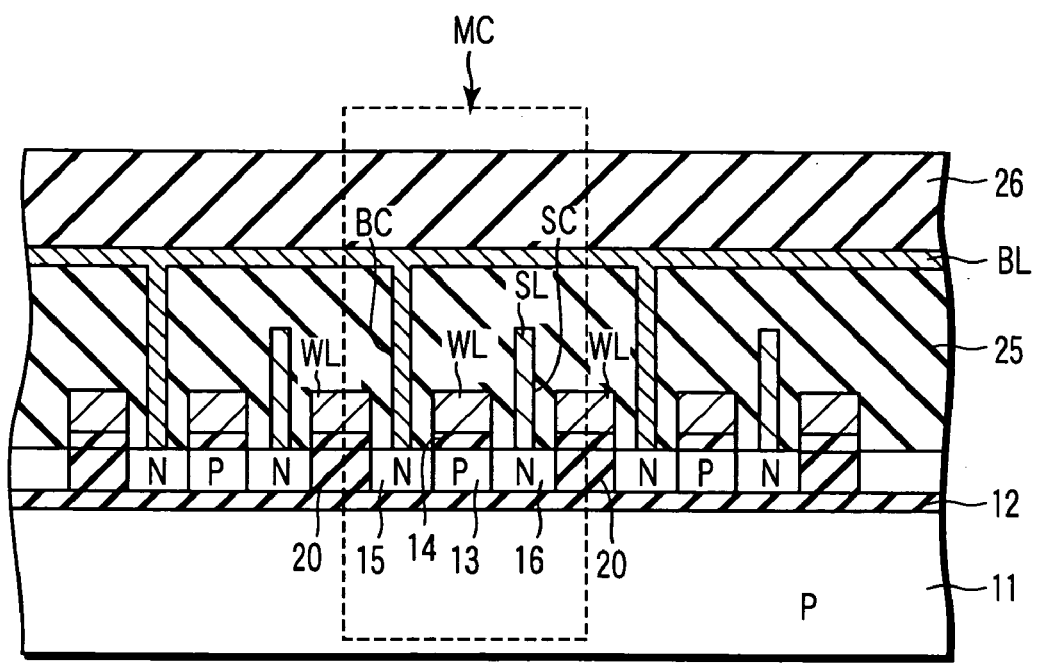
FIG. 15 is a cross-sectional view schematically showing the semiconductor memory device taken along the 15—15 line of FIG. 14.

FIG. 14 is a plan view schematically showing one example of a memory cell array of a semiconductor memory device according to a modification 2. FIG. 15 is a cross-sectional view schematically taken along the 15—15 line of FIG. 14 and viewed in the arrow direction. FIG. 16 is a cross-sectional view schematically taken along the 16—16 line of FIG. 14 and viewed in the arrow direction. The dimension (cell size) of the memory cell MC of one bit unit is $10F^2$ if the minimum processing size is F.

Figure 16:
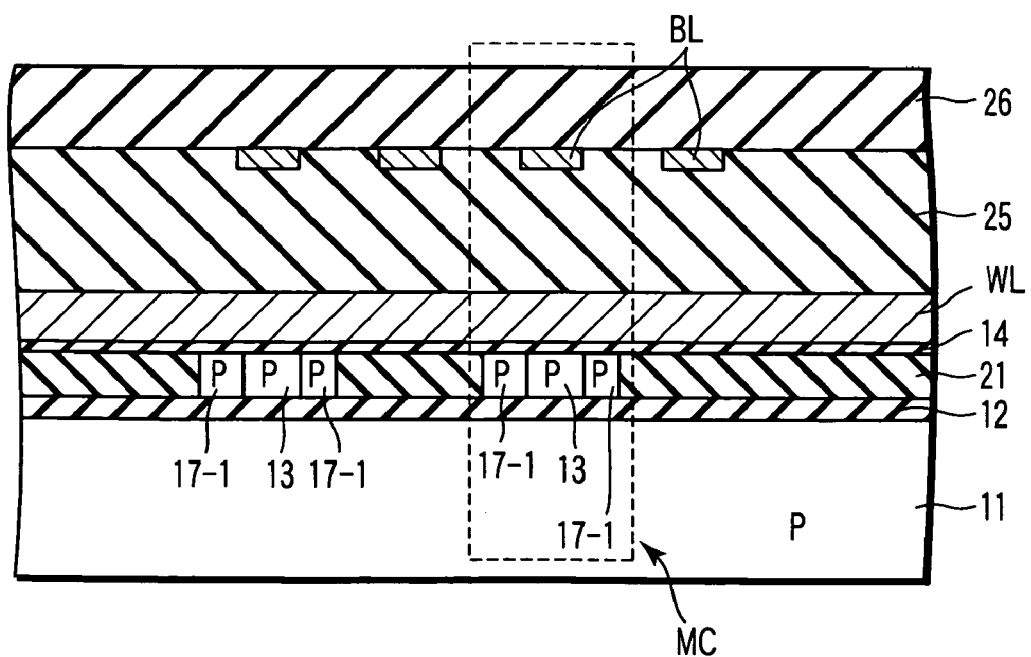
FIG. 16 is a cross-sectional view schematically showing the semiconductor memory device taken along the 16—16 line of FIG. 14 and viewed in the arrow direction.

As shown in FIGS. 14 and 16, P-type silicon layers 17-1 which are uniformly formed to extend in the word line WL direction are formed adjacent to and on both sides of each P-type silicon layer 13.

With the above configuration, the same effect as that of the first embodiment can be attained. Further, since the P-type silicon layers 17-1 are uniformly formed to extend in the word line WL direction on both sides of each P-type silicon layer 13, a more symmetrical configuration can be attained. Therefore, the pitch of the bit lines BL becomes constant, the pattern symmetry becomes higher and the load in the lithography process can be reduced. Further, the pattern of the SOI layer becomes symmetrical, the load in the lithography process can be reduced and the memory cell can be easily miniaturized.

[Modification 3]

Next, a semiconductor memory device according to a modification of the second embodiment is explained with reference to FIGS. 17 to 20. In the following explanation, the repetitive explanation for the same portion as that of the second embodiment is omitted.

Figure 17:
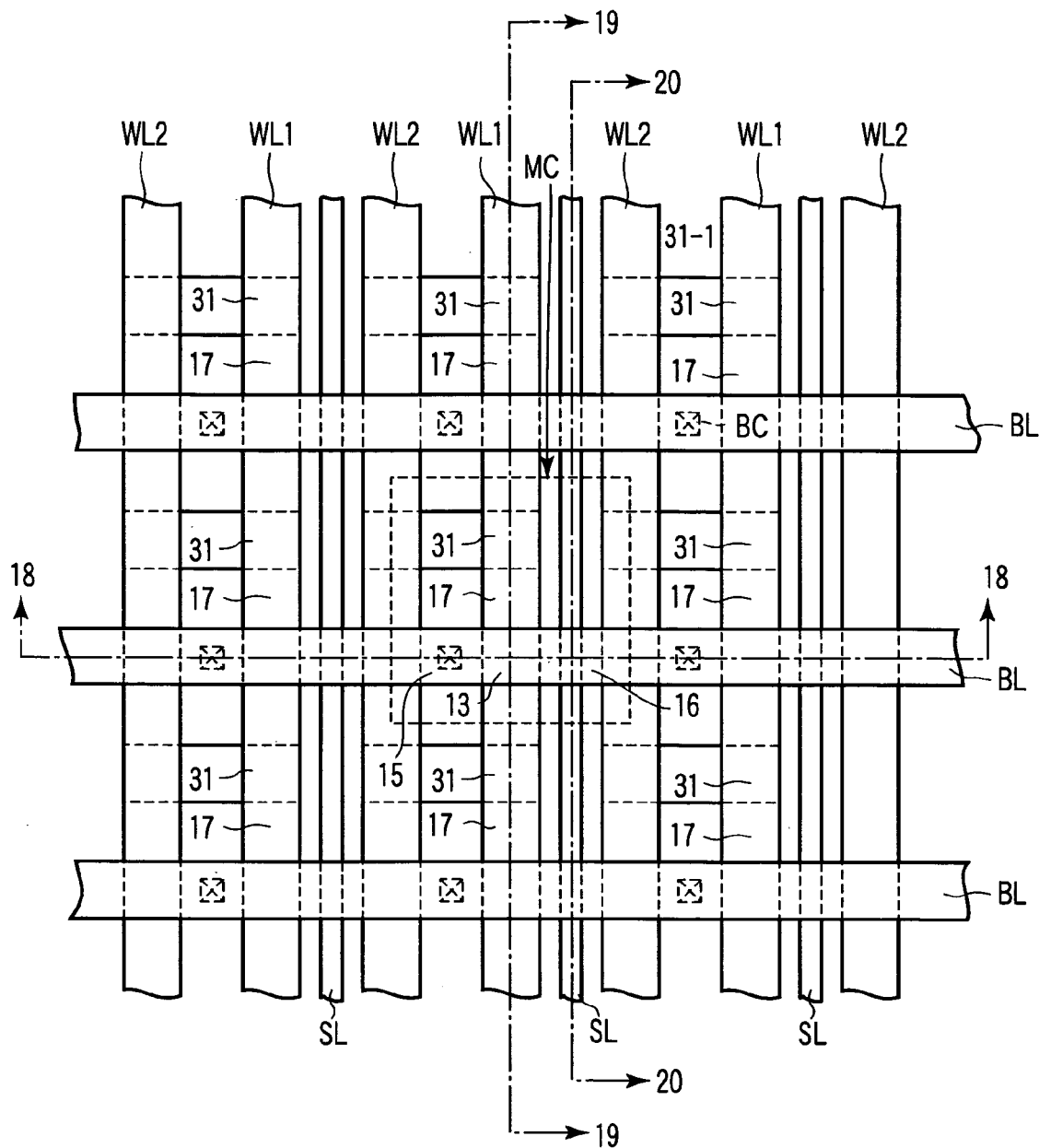
FIG. 17 is a plan view schematically showing a semiconductor memory device according to a modification 3 of this invention.
Figure 18:
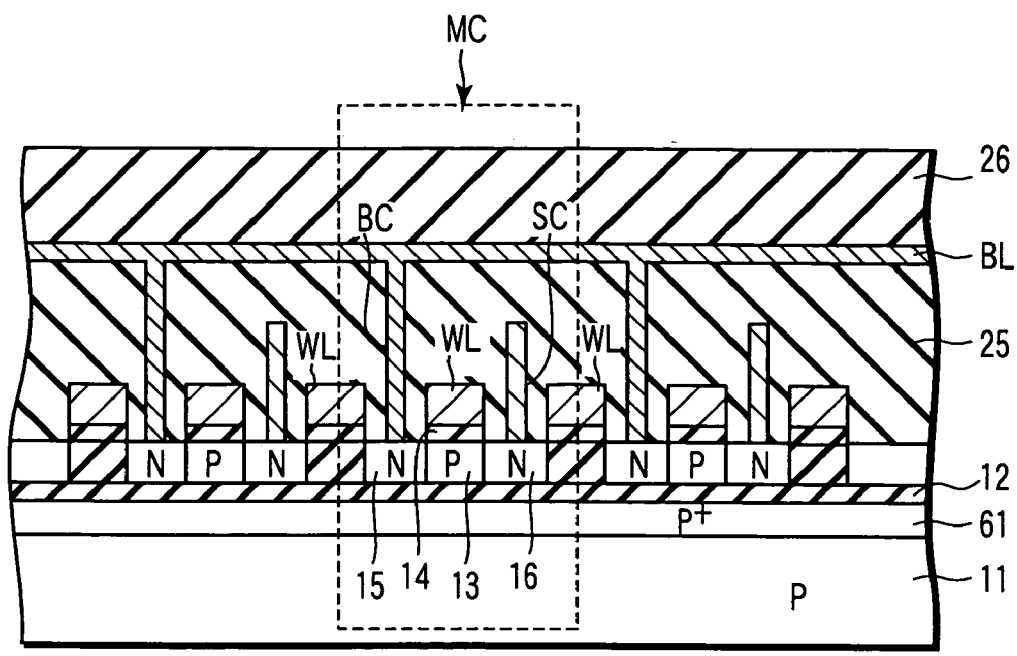
FIG. 18 is a cross-sectional view schematically showing the semiconductor memory device taken along the 18—18 line of FIG. 17 and viewed in the arrow direction.
Figure 19:
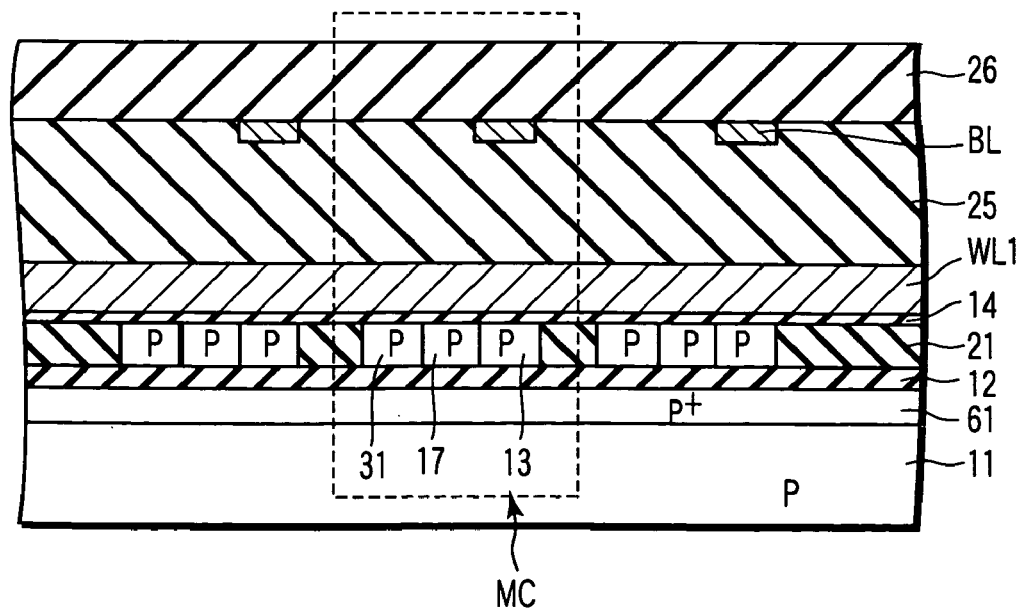
FIG. 19 is a cross-sectional view schematically showing the semiconductor memory device taken along the 19—19 line of FIG. 17 and viewed in the arrow direction.
Figure 20:
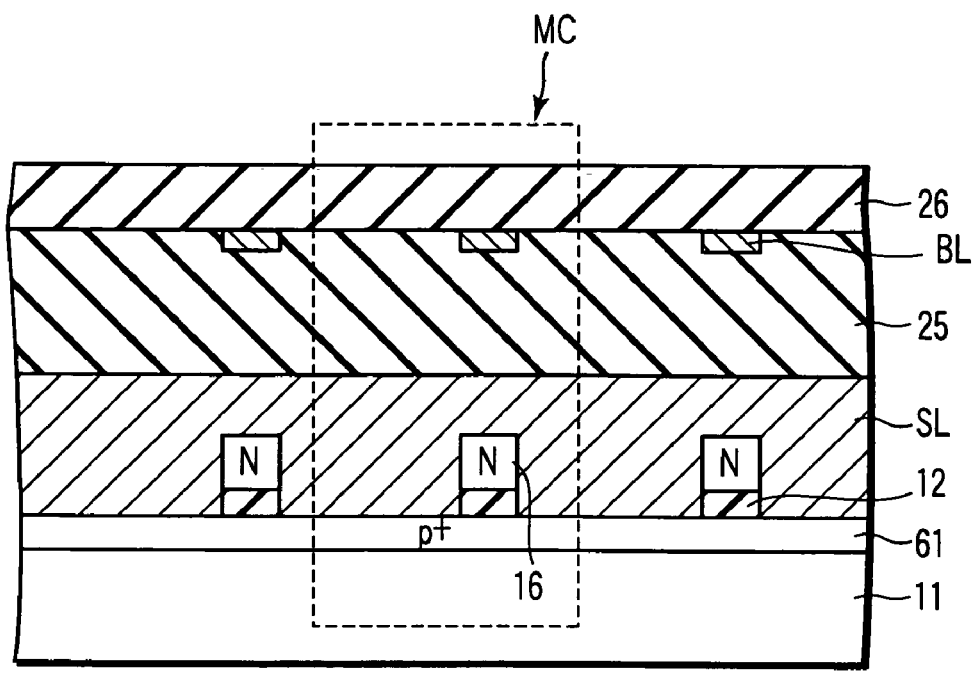
FIG. 20 is a cross-sectional view schematically showing the semiconductor memory device taken along the 20—20 line of FIG. 17 and viewed in the arrow direction.

FIG. 17 is a plan view schematically showing one example of a memory cell array of a semiconductor memory device according to a modification 3. FIG. 18 is a cross-sectional view taken along the 18—18 line of FIG. 17 and viewed in the arrow direction. FIG. 19 is a cross-sectional view taken along the 19—19 line of FIG. 17 and viewed in the arrow direction. FIG. 20 is a cross-sectional view taken along the 20—20 line of FIG. 17 and viewed in the arrow direction. The dimension (cell size) of the memory cell MC of one bit unit is $16F^2$.

As shown in FIG. 17, P-type silicon layers 31 are formed to extend in a direction opposite to that of the semiconductor device of the second embodiment in the bit line BL direction.

Further, as shown in FIGS. 18 to 20, it is desirable to form a $P^+$-type silicon layer 61 between a substrate 11 and a buried insulating layer 12. The $P^+$-type silicon layer 61 and P-type substrate may be replaced by an $N^+$-type silicon layer and N-type substrate. Alternatively, the substrate 11 itself may be a $P^+$-type substrate or $N^+$-type substrate. Further, the conductivity types of the substrate 11 and silicon layer 61 may be different from each other. Application of potentials to the substrate 11 and silicon layer 61 can be easily attained by use of contacts from the surface in the peripheral portion of the cell array as required, for example.

As shown in FIG. 20, common source lines SL in the modification 3 are so-called strap type common source lines SL which are each formed in contact with the upper surfaces and side surfaces of the source regions 16 and the surface of the P-type silicon layer 61.

With the above configuration, the same effect as that of the second embodiment can be attained. Further, the P-type silicon layers 31 are formed to extend in a direction opposite to that of the semiconductor device of the second embodiment in the bit line BL direction. Therefore, the common source lines SL can be used and the resistance of contacts to the sources can be reduced by forming the common source lines by use of a line pattern and the manufacturing yield can be enhanced since there occurs no possibility that the contacts are not completely formed.

Further, the potentials applied to the common source lines SL and substrate 11 can be commonly used in the cell array by strapping the source and substrate, the potential of the source region 16 and the potential of the substrate 11 become stable and highly resistant to noise and the operation margin can be enhanced. Further, if the source and substrate are set to the same potential, even when the contact to the source is deviated from the SOI layer and short-circuited to the substrate, no fault occurs. Therefore, the manufacturing yield can be enhanced irrespective of the contact forming method.

[Modification 4]

Next, a semiconductor memory device according to a modification of the fourth embodiment is explained with reference to FIGS. 21 to 24. In the following explanation, the repetitive explanation for the same portion as that of the fourth embodiment is omitted.

Figure 24:
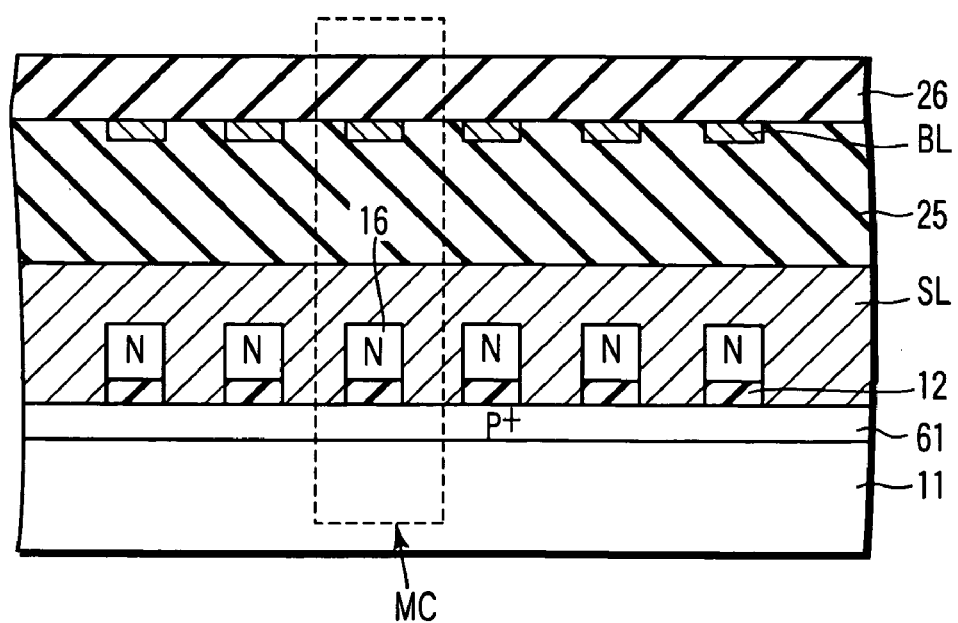
FIG. 24 is a cross-sectional view schematically showing the semiconductor memory device taken along the 24—24 line of FIG. 21 and viewed in the arrow direction.
Figure 21:
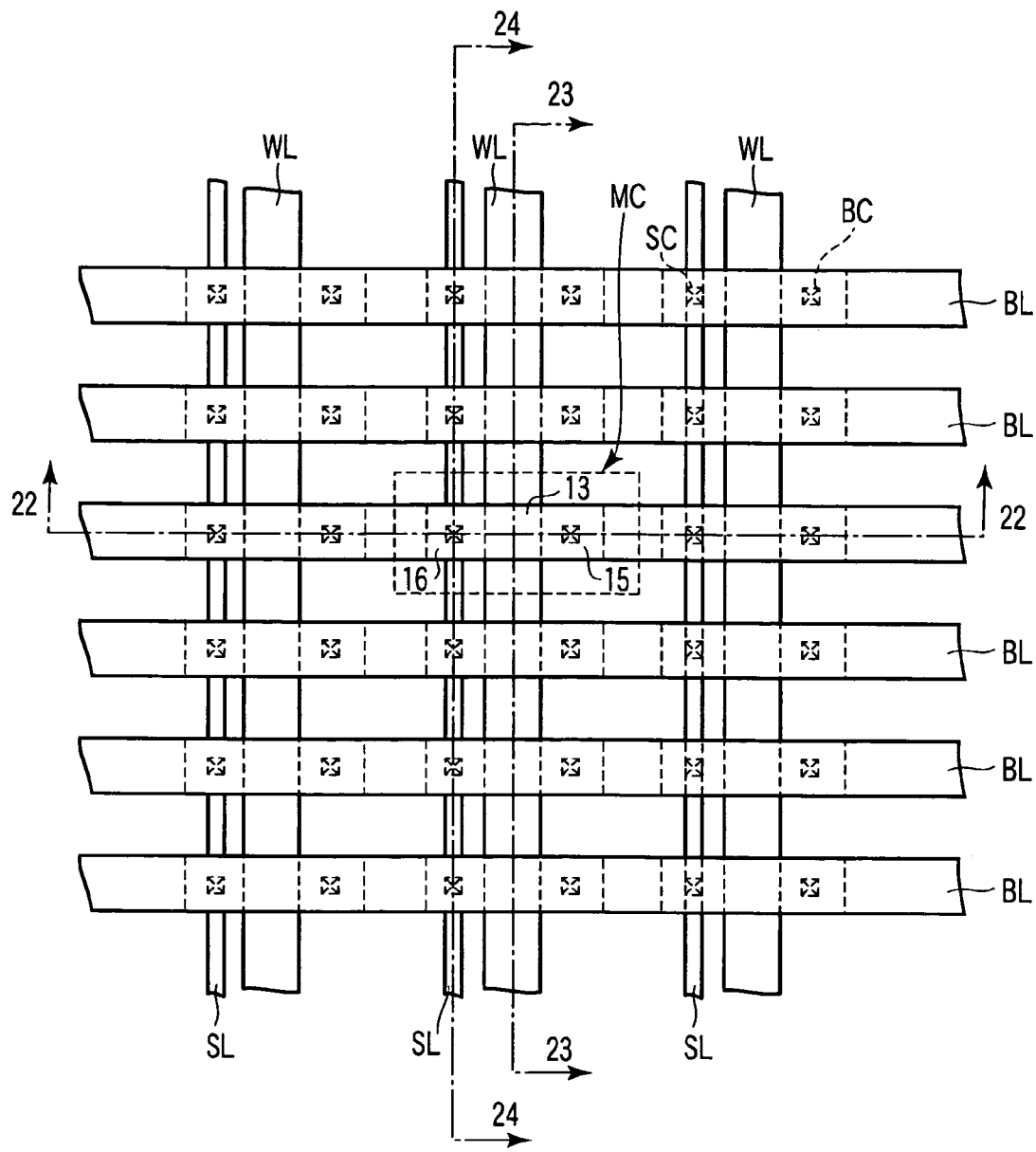
FIG. 21 is a plan view schematically showing a semiconductor memory device according to a modification 4 of this invention.
Figure 22:
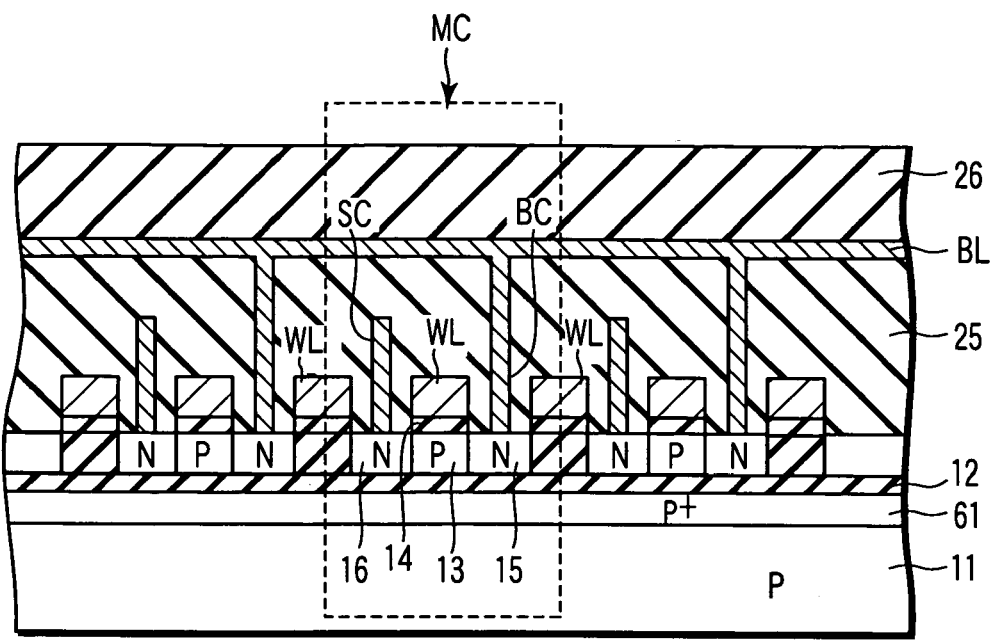
FIG. 22 is a cross-sectional view schematically showing the semiconductor memory device taken along the 22—22 line of FIG. 21 and viewed in the arrow direction.
Figure 23:
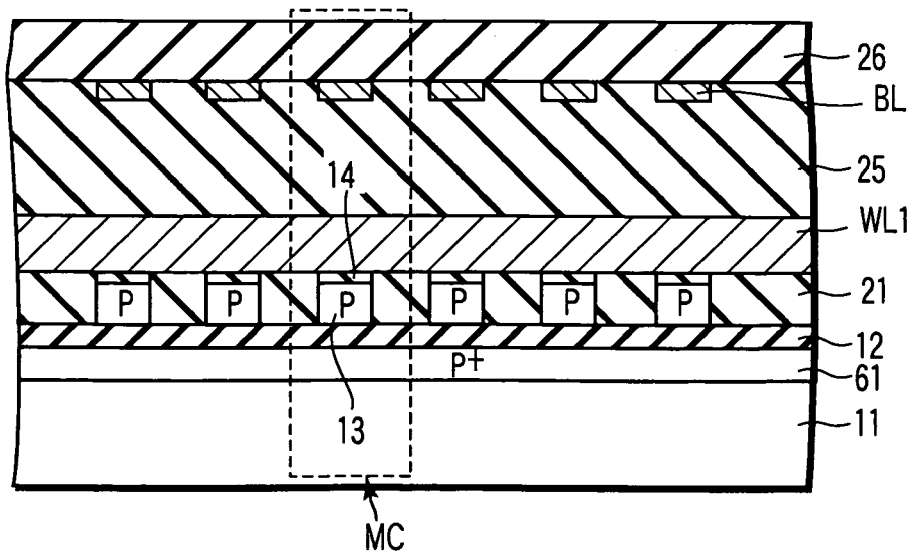
FIG. 23 is a cross-sectional view schematically showing the semiconductor memory device taken along the 23—23 line of FIG. 21 and viewed in the arrow direction.

FIG. 21 is a plan view schematically showing one example of a memory cell array of a semiconductor memory device according to a modification 4. FIG. 22 is a cross-sectional view taken along the 22—22 line of FIG. 21 and viewed in the arrow direction. FIG. 23 is a cross-sectional view taken along the 23—23 line of FIG. 21 and viewed in the arrow direction. FIG. 24 is a cross-sectional view taken along the 24—24 line of FIG. 21 and viewed in the arrow direction. The dimension (cell size) of the memory cell MC of one bit unit is $8F^2$.

As shown in FIGS. 21 to 24, common source lines SL are of a strap type and a $P^+$-type silicon layer 61 is provided. Further, extension regions of the P-type silicon layers 17 are not formed. It is assumed that the buried insulating film 12 can be made sufficiently thin or the SOI layer can be made thinner to further miniaturize the MOSFETs, although the extension regions are not formed. In this case, sufficiently large storage capacitances between the substrate and the common source line and channel body can be attained, and therefore, the extension region of the channel body can be made unnecessary. However, if the contacts of the bit line and source line to the SOI layer are deviated from the SOI layer due to misalignment or a variation in the dimension, they penetrate through a thin element isolation region (the film thickness of the element isolation region varies along with the film thicknesses of the SOI layer and buried insulating film) and are easily short-circuited to the substrate. Also, in this case, it is extremely effective to apply a measure for short-circuiting the source and substrate by using the strap type common source line and penetration contact used in the above embodiment.

With the above configuration, particularly, a fault in a whole array due to a short circuit of the substrate to the source lines which are considered to be set at the common potential in the array can be avoided and the manufacturing yield can be greatly enhanced. Further, the bit line contact may be processed so that a fault in the whole array will not occur by performing a process so as not to use a bit line corresponding thereto. Therefore, the process margin can be extremely enhanced.

[Modification 5]

Next, a semiconductor memory device according to a modification of the second embodiment is explained with reference to FIGS. 25 to 28. In the following explanation, the repetitive explanation for the same portion as that of the second embodiment is omitted.

Figure 26:
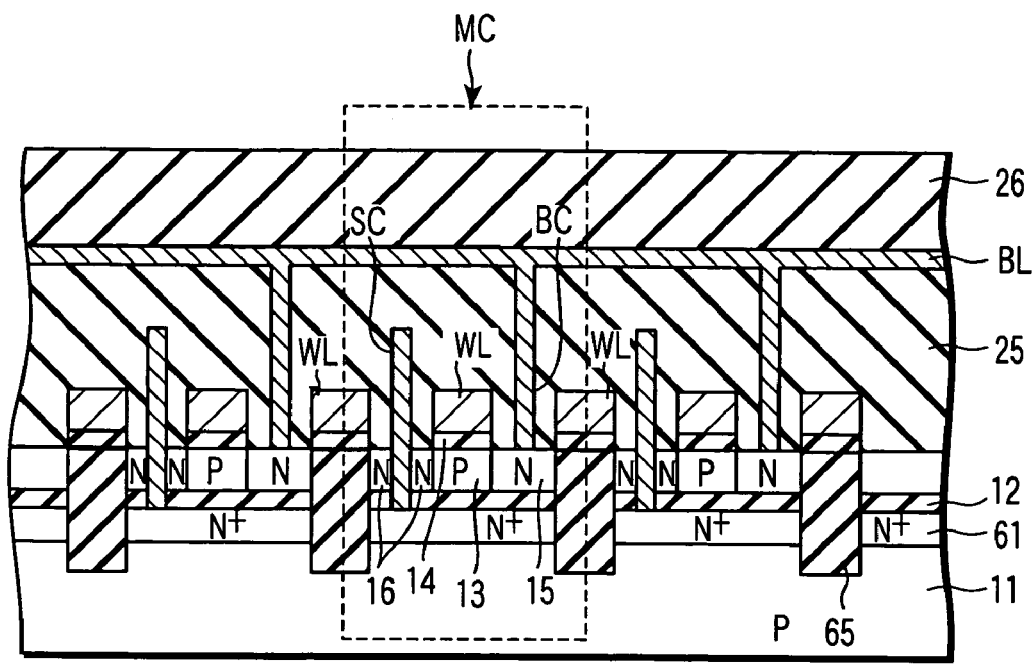
FIG. 26 is a cross-sectional view schematically showing the semiconductor memory device taken along the 26—26 line of FIG. 25 and viewed in the arrow direction.
Figure 27:
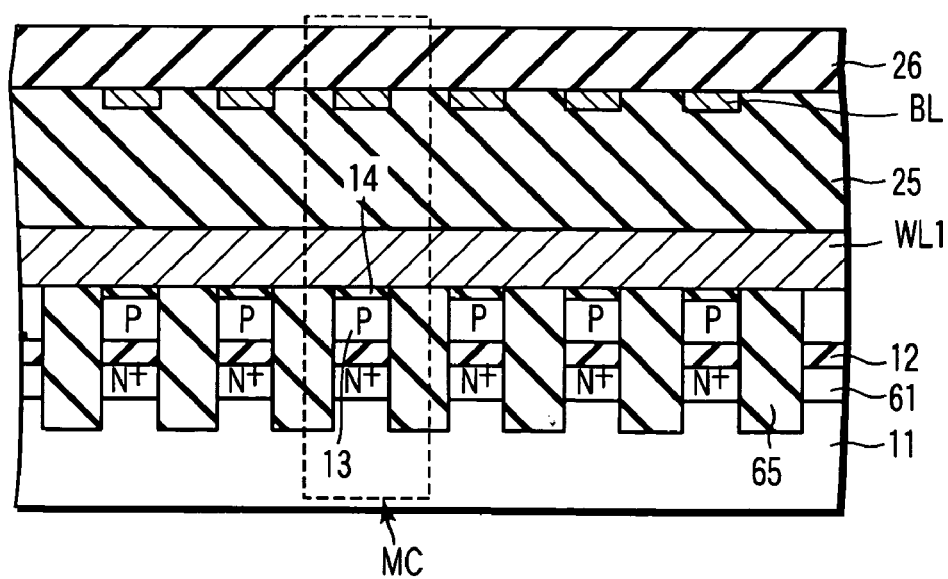
FIG. 27 is a cross-sectional view schematically showing the semiconductor memory device taken along the 27—27 line of FIG. 25 and viewed in the arrow direction.
Figure 28:
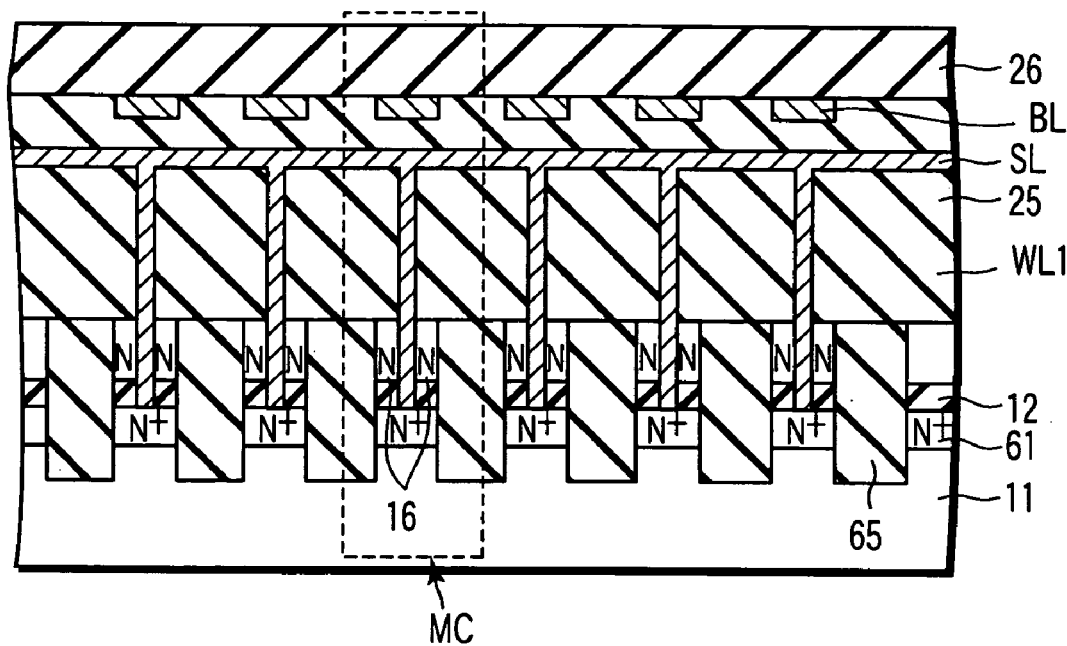
FIG. 28 is a cross-sectional view schematically showing the semiconductor memory device taken along the 28—28 line of FIG. 25 and viewed in the arrow direction.

FIG. 25 is a plan view schematically showing one example of a memory cell array of the semiconductor memory device according to a modification 5. FIG. 26 is a cross-sectional view taken along the 26—26 line of FIG. 25 and viewed in the arrow direction. FIG. 27 is a cross-sectional view taken along the 27—27 line of FIG. 25 and viewed in the arrow direction. FIG. 28 is a cross-sectional view taken along the 28—28 line of FIG. 25 and viewed in the arrow direction. The dimension (cell size) of the memory cell MC of one bit unit is $8F^2$.

Figure 29:
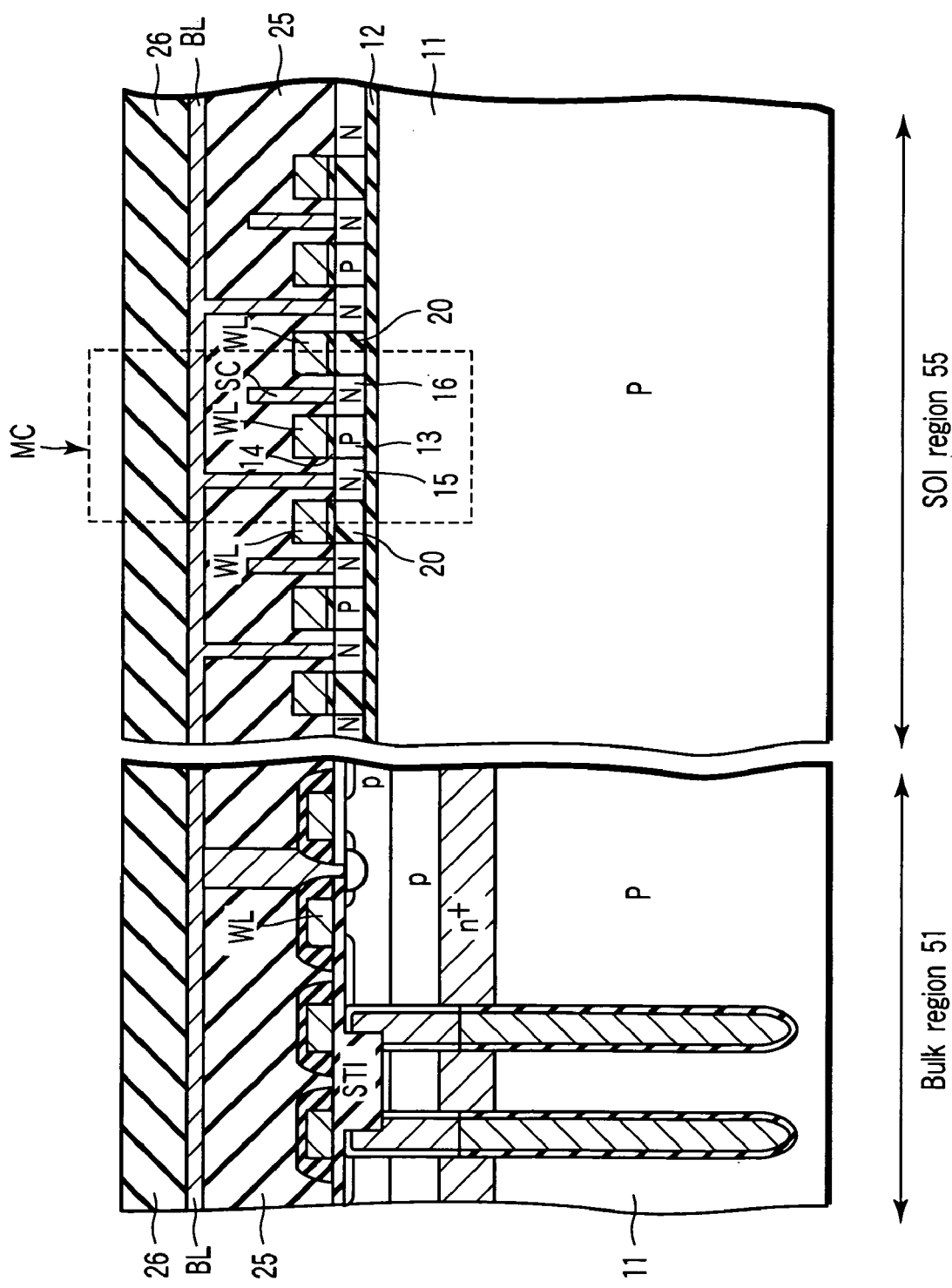
FIG. 29 is a cross-sectional view schematically showing an example in which a DRAM is formed as a bulk element on a bulk region and the semiconductor memory device according to the first embodiment is formed on an SOI region.

As shown in FIGS. 26 and 29, common source line contacts SC are formed to penetrate through the source region 16 and insulating film 12 and reach to the depth of the surface of an $N^+$-type silicon layer 61. Therefore, each common source line SL is connected to the rear surfaces of the P-type silicon layers 13 which are used as channel bodies of the memory cells MC via the $N^+$-type silicon layer 61.

Further, as shown in FIGS. 26 to 29, element isolation insulating films 65 which penetrate through the insulating film 12 and $N^+$-type silicon layer 61 are formed in the substrate 11 to isolate the memory cells MC in the word line WL direction.

As explained above, the common source line contacts SC are formed to penetrate through the source regions 16 and insulating film 12 and formed to the depth of the surface of the $N^+$-type silicon layer 61. Therefore, each common source line SL is connected to the rear surfaces of the P-type silicon layers 13 which are used as channel bodies of the memory cells MC via the substrate 11 and $N^+$-type silicon layer 61. In addition, the element isolation insulating films 65 which penetrate through the insulating film 12 and $N^+$-type silicon layer 61 are formed in the substrate 11 to isolate the memory cells MC in the word line WL direction.

Thus, by the same function as that of the second word lines WL2, a sufficiently large coupling capacitance can be formed between the common source line SL and the P-type silicon layer 13 used as the channel body. That is, by applying a desired potential to the common source line SL, a sufficiently large coupling capacitance can be formed with respect to the channel body (P-type silicon layer 13). Therefore, the amount of charges stored on the channel body can be increased and the potential of the channel body can be independently controlled for each common memory cell group connected to the common source line SL and arranged in the WL direction. As a result, the operation of the memory cell MC can be made more stable. This effect can also be attained when using the strap type.

The semiconductor memory devices according to the embodiments and modifications explained above may be combined with bulk elements and circuits formed on a bulk region on a so-called normal semiconductor substrate. If the semiconductor memory devices according to the embodiments and modifications are combined with the bulk elements or the like, for example, a semiconductor chip which is effective as a system LSI such as an system on chip (SoC) type high-performance system LSI can be provided.

One example in which this invention is applied to the SoC type high-performance system LSI is explained with reference to FIG. 29. FIG. 29 is a cross-sectional view schematically showing an example in which a DRAM is formed as a bulk element on a bulk region 51 and the semiconductor memory device according to the first embodiment is formed on an SOI region 55.

As shown in FIG. 29, a so-called trench type DRAM cell array is formed in the main surface of the P-type semiconductor substrate 11 in the bulk region 51. By forming the DRAM cell array in the bulk region 51, a problem caused by the floating substrate effect can be avoided. The plan view and the detailed explanation thereof are omitted.

Thus, by forming the semiconductor element in an optimum region among the bulk region 51 and SOI region 55 depending on the characteristic of the semiconductor element, a high-speed, high-performance system LSI can be provided.

This invention has been explained by using the first to fourth embodiments and modifications 1 to 5, but the contents explained in the embodiments of this invention are variously combined or partly extracted and adequately performed. Further, the wiring configuration and element structure can be modified and applied by freely utilizing the conventional technique without departing from the technical scope thereof. Alternatively, by using an SOI wafer in which a bulk region is partly formed as described above, a hybrid chip including a logic circuit and a peripheral circuit of the memory as a bulk element (circuit) can be provided.

What is claimed is:

1. A semiconductor memory device comprising:
    first word lines,
    bit lines arranged to intersect the first word lines, and
    a plurality of MIS transistors arranged at intersections of the first word lines and bit lines and each configuring a memory cell, each of the plurality of MIS transistors includes a channel body formed in a semiconductor layer on an insulating film and set in an electrically floating state, a first extension region formed in contact with the channel body in the semiconductor layer and arranged in a direction of the first word line, a gate insulating film formed on the channel body, a gate electrode formed on the gate insulating film and electrically connected to a corresponding one of the first word lines, and source and drain regions separately formed in a direction of the bit line in the semiconductor layer to sandwich the channel body.

2. A semiconductor memory device comprising:
    first word lines,
    bit lines arranged to intersect the first word lines, and
    a plurality of fin-gate-type transistors arranged at intersections of the first word lines and bit lines and each configuring a memory cell, each of the plurality of fin-gate-type transistors includes a channel body formed in a semiconductor layer on an insulating film and set in an electrically floating state, a gate insulating film formed on the channel body of the semiconductor layer and facing side walls thereof, a double-gate electrode formed to extend from one of the side walls of the semiconductor layer onto the semiconductor layer and the other side wall on the gate insulating film and electrically connected to a corresponding one of the first word lines, and source and drain regions separately formed in a direction of the bit line in the semiconductor layer to sandwich the channel body.

3. The semiconductor memory device according to claim 1, wherein the memory cell dynamically stores a first state in which the channel body is set to a first potential and a second state in which the channel body is set to a second potential.

4. The semiconductor memory device according to claim 2, wherein the memory cell dynamically stores a first state in which the channel body is set to a first potential and a second state in which the channel body is set to a second potential.

5. The semiconductor memory device according to claim 1, which further comprises an element isolation film which is provided between memory cells adjacent in the bit line direction and electrically isolates the adjacent memory cells and in which the source and drain regions of the MIS transistor are formed to a depth to reach the insulating film and the channel body is set to an electrically floating state by the source and drain regions and element isolation film.

6. The semiconductor memory device according to claim 2, which further comprises an element isolation film which is provided between memory cells adjacent in the bit line direction and electrically isolates the adjacent memory cells and in which the source and drain regions of the fin-gate-type transistor are formed to depth to reach the insulating film and the channel body is set to an electrically floating state by the source and drain regions and element isolation film.

7. The semiconductor memory device according to claim 1, further comprising bit line contacts formed on the drain regions to electrically connect the bit lines to the drain regions, and common source line contacts formed on the source regions.

8. The semiconductor memory device according to claim 2, further comprising bit line contacts formed on the drain regions to electrically connect the bit lines to the drain regions, and common source line contacts formed on the source regions and applied with a preset fixed potential.

9. The semiconductor memory device according to claim 1, further comprising second word lines provided between the first word lines, and second extension regions formed to extend in the bit line direction in the MIS transistors and connected to the first extension regions and second word lines.

10. The semiconductor memory device according to claim 2, in which the drain region of the MIS transistor is formed to a depth shallower than the depth of the insulating film and which further comprises first extension regions connected to the channel bodies and formed between the drain regions and the insulating film.

11. The semiconductor memory device according to claim 2, in which the source region of the MIS transistor is formed to a depth shallower than the depth of the insulating film and which further comprises first extension regions connected to the channel bodies and formed between the source regions and the insulating film, the first extension region being capacitively coupled with the source region by a preset fixed potential applied to the source region.

12. The semiconductor memory device according to claim 11, further comprising second word lines respectively formed adjacent to and on one side of the first word lines and arranged in the first word line direction, and second extension regions connected to the first extension regions in the MIS transistors and arranged between the second word lines and the insulating film.

13. The semiconductor memory device according to claim 12, further comprising inversion preventing layers formed on interfaces between the second extension regions and the second word lines and having the same conductivity type as the second extension regions and an impurity concentration higher than the second extension regions.

14. The semiconductor memory device according to claim 7, wherein the insulating film is formed on a semiconductor substrate and the common source line contacts are each formed to penetrate through the source region and insulating film and extend into the semiconductor substrate.

15. The semiconductor memory device according to claim 7, further comprising common source lines formed in the first word line direction and electrically connected to the common source line contacts in the plurality of MIS transistors.

16. The semiconductor memory device according to claim 12, further comprising dummy word lines formed on the other side of the first word lines to extend in the first word line direction, the dummy word lines functioning to electrically isolate the plurality of MIS transistors which are adjacent in the bit line direction.

17. The semiconductor memory device according to claim 1, in which the insulating film is formed on a semiconductor substrate and which further comprises bulk elements formed in the main surface area of the semiconductor substrate.

18. The semiconductor memory device according to claim 15, wherein the common source line is of a strap type.

19. The semiconductor memory device according to claim 5, wherein the element isolation film are each formed to penetrate through the insulating film and extend into the main surface of the semiconductor substrate.

* * * * *